United States Patent
Masumoto

(10) Patent No.: US 12,033,916 B2
(45) Date of Patent: Jul. 9, 2024

(54) SEMICONDUCTOR DEVICE AND SEMICONDUCTOR MODULE WITH IMPROVED HEAT DISSIPATION

(71) Applicant: Mitsubishi Electric Corporation, Tokyo (JP)

(72) Inventor: Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 639 days.

(21) Appl. No.: 17/078,410

(22) Filed: Oct. 23, 2020

(65) Prior Publication Data
US 2021/0225731 A1   Jul. 22, 2021

(30) Foreign Application Priority Data
Jan. 17, 2020 (JP) .................................. 2020-005894

(51) Int. Cl.
*H01L 23/40* (2006.01)
*H01L 23/13* (2006.01)

(52) U.S. Cl.
CPC .......... *H01L 23/4006* (2013.01); *H01L 23/13* (2013.01); *H01L 2023/4062* (2013.01); *H01L 2023/4068* (2013.01); *H01L 2023/4087* (2013.01)

(58) Field of Classification Search
CPC . H01L 23/36–3738; H01L 23/40–4093; H01L 2023/4068
See application file for complete search history.

(56) References Cited

U.S. PATENT DOCUMENTS

2018/0286788 A1   10/2018   Iso
2021/0202330 A1*   7/2021   Iizuka ................. H01L 23/3735

FOREIGN PATENT DOCUMENTS

| JP | 3669980 B2 | 7/2005 |
| JP | 2005-278384 A | 10/2005 |
| JP | 2014-049726 A | 3/2014 |

(Continued)

OTHER PUBLICATIONS

An Ofice Action maild by China National Intellectual Property Administration on Jan. 10, 2024, which corresponds to Chinese Patent Application No. 202110034738.X and is related to U.S. Appl. No. 17/078,410; with English language translation.

(Continued)

*Primary Examiner* — Laura M Menz
*Assistant Examiner* — Candice Chan
(74) *Attorney, Agent, or Firm* — Studebaker & Brackett PC

(57) ABSTRACT

A semiconductor device includes a base plate, a semiconductor chip, a case, a heat dissipation member, and a plurality of attachment portions. The semiconductor chip is held on a front surface side of the base plate. The case is provided on a front surface of the base plate so as to house the semiconductor chip inside. The heat dissipation member is provided on a back surface of the base plate and contactable with a heat sink for cooling the semiconductor chip. The plurality of attachment portions have a function of attaching the case to the heat sink. Ends of the heat dissipation member in a direction extending along a long side of a plurality of sides that form a shape defined by connecting positions of the plurality of attachment portions in plan view are located between the two attachment portions that form the long side.

14 Claims, 22 Drawing Sheets

(56) References Cited

FOREIGN PATENT DOCUMENTS

| | | | |
|---|---|---|---|
| JP | 2018-181893 A | 11/2018 | |
| WO | WO-2019102537 A1 * | 5/2019 | ........... H01L 23/049 |

OTHER PUBLICATIONS

An Office Action; "Notice of Reasons for Refusal," mailed by the Japanese Patent Office on Jan. 10, 2023, which corresponds to Japanese Patent Application No. 2020-005894 and is related to U.S. Appl. No. 17/078,410; with English language translation.

* cited by examiner

SEMICONDUCTOR DEVICE AND SEMICONDUCTOR MODULE WITH IMPROVED HEAT DISSIPATION

BACKGROUND OF THE INVENTION

Field of the Invention

The present disclosure relates to a semiconductor device and a semiconductor module.

Description of the Background Art

As a structure for dissipating the heat generated inside a semiconductor device, a structure is known in which a heat dissipation sheet is provided between a base plate and a heat sink of the semiconductor device, and then the semiconductor device and the heat sink are fixed by screwing. In this structure, the contact between the base plate and the heat dissipation sheet or the contact between the heat dissipation sheet and the heat sink affects heat dissipation.

Japanese Patent No. 3669980 proposes a module structure including a ceramic circuit board having a cutout portion and a module cap that presses the ceramic circuit board.

In the structure in which a heat dissipation member is provided between a base plate and a heat sink of a semiconductor device and the semiconductor device and the heat sink are tightened together with screws, the base plate receives reaction force from the heat sink. When the base plate is curved in a concave shape due to the reaction force, the surface pressure in a central portion of the base plate becomes small. Therefore, the contact between the semiconductor device and the heat dissipation member or the contact between the heat dissipation member and the heat sink deteriorates. During the operation of the semiconductor device, heat tends to be concentrated in the central portion of the base plate, and hence if the contact in the central portion is insufficient, the heat dissipation of the semiconductor device is lowered.

SUMMARY

In order to solve the above problem, the present disclosure provides a semiconductor device in which heat dissipation to a heat sink via a heat dissipation member is improved.

A semiconductor device according to the present disclosure includes a base plate, a semiconductor chip, a case, a heat dissipation member, and a plurality of attachment portions. The semiconductor chip is held on a front surface side of the base plate. The case is provided on a front surface of the base plate so as to house the semiconductor chip inside. The heat dissipation member is provided on a back surface of the base plate and contactable with a heat sink for cooling the semiconductor chip. The plurality of attachment portions have a function of attaching the case to the heat sink. Ends of the heat dissipation member in a direction extending along a long side of a plurality of sides that form a shape defined by connecting positions of the plurality of attachment portions in plan view are located between the two attachment portions that form the long side.

According to the present disclosure, there is provided a semiconductor device in which heat dissipation to the heat sink via the heat dissipation member is improved.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

First Preferred Embodiment

Figure 1:
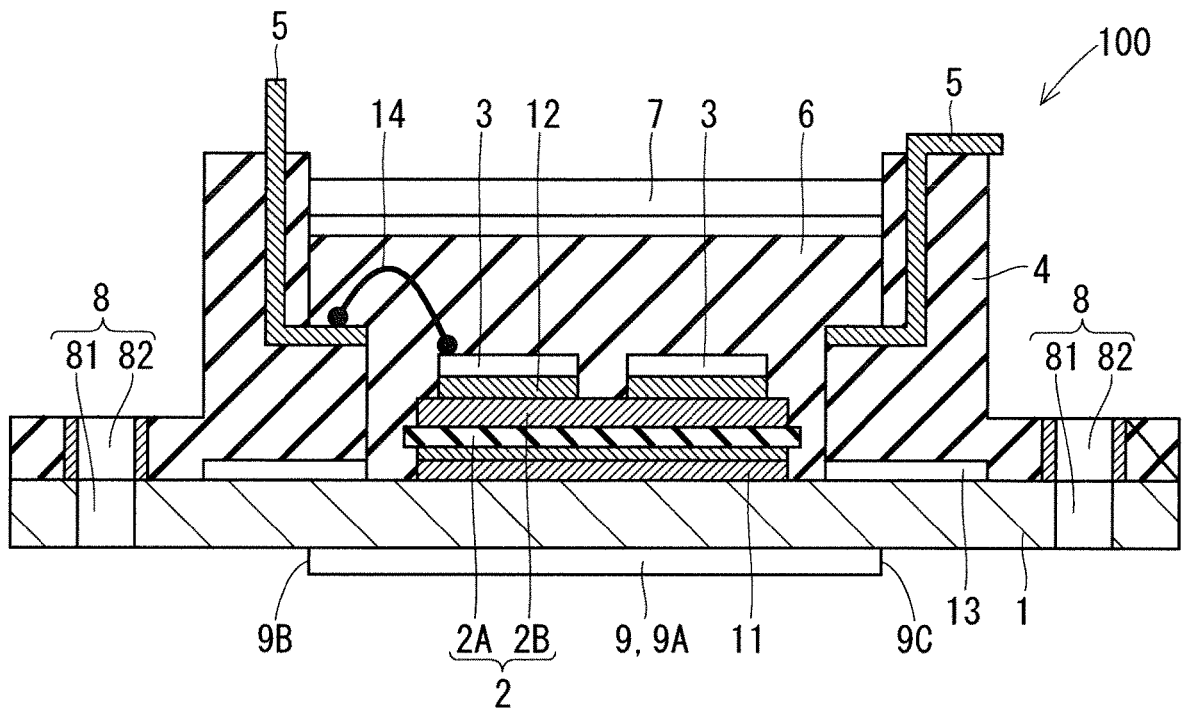
FIG. 1 is a cross-sectional view illustrating a configuration of a semiconductor device according to a first preferred embodiment.

FIG. 1 is a cross-sectional view illustrating a configuration of a semiconductor device 100 according to a first preferred embodiment.

Figure 2:
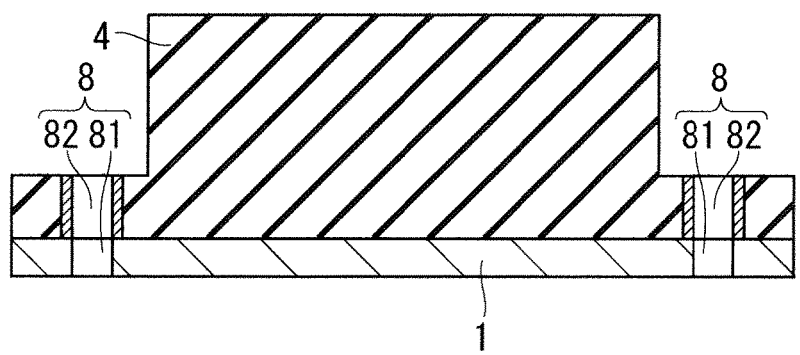
FIG. 2 is a cross-sectional view illustrating configurations of a case and a base plate in the first preferred embodiment.
Figure 3:
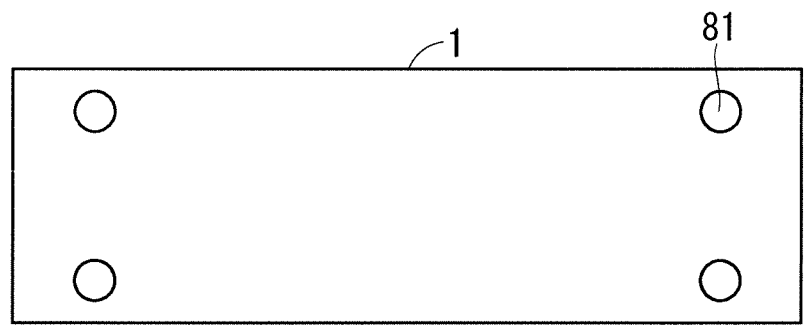
FIG. 3 is a bottom view illustrating the configuration of the base plate in the first preferred embodiment.

The semiconductor device 100 includes a base plate 1, an insulating substrate 2, a semiconductor chip 3, a case 4, an electrode terminal 5, a sealing material 6, a lid 7, a plurality of attachment portions 8, and a heat dissipation member 9. FIG. 2 is a cross-sectional view illustrating configurations of the case 4 and the base plate 1 in the first preferred embodiment. In FIG. 2, an internal configuration of the case 4 is not illustrated. FIG. 3 is a bottom view illustrating the configuration of the base plate 1 in the first preferred embodiment.

The base plate 1 forms a bottom of the semiconductor device 100. A planar shape of the base plate 1 in the first preferred embodiment is a rectangle. A first through hole 81 that forms the attachment portion 8 described later is provided in an outer peripheral portion of the base plate 1.

The insulating substrate 2 is joined to a front surface of the base plate 1 via solder 11. The insulating substrate 2 includes an insulating layer 2A made of resin or ceramic and a circuit pattern 2B provided on a front surface of the insulating layer 2A.

The semiconductor chip 3 is joined to the circuit pattern 2B of the insulating substrate 2 via solder 12. That is, the semiconductor chip 3 is held on a front surface side of the base plate 1. In the first preferred embodiment, two semiconductor chips 3 are arranged side by side on the circuit pattern 2B. The semiconductor chip 3 is formed of, for example, a semiconductor such as Si, or a so-called wide band gap semiconductor such as SiC or GaN. The semiconductor chip 3 is, for example, a power semiconductor chip, a control IC (Integrated Circuit) for controlling the power semiconductor chip, etc. The semiconductor chip 3 is, for example, an IGBT (Insulated Gate Bipolar Transistor), a MOSFET (Metal Oxide Semiconductor Field Effect Transistor), a Schottky barrier diode, etc.

The case 4 has a frame shape. The case 4 is provided on the front surface of the base plate 1 so as to house the semiconductor chip 3 inside the frame shape. The case 4 is joined to the base plate 1 via an adhesive material 13. In the first preferred embodiment, an outer shape of the case 4 in plan view is a rectangle. The size of a back surface of the case 4 is the same as the size of the base plate 1. A second through hole 82 that forms the attachment portion 8 described later is provided in an outer peripheral portion of the case 4. The second through hole 82 is formed by, for example, a bush embedded in the case 4.

The electrode terminal 5 is embedded in, for example, the case 4, and is formed as a part integrated with the case 4. One end of the electrode terminal 5 is connected to the semiconductor chip 3 by internal wiring such as, for example, a wire 14. The other end of the electrode terminal 5 is provided to be capable of being connected to an external circuit. In FIG. 1, only a part of the internal wiring between the electrode terminal 5 and the semiconductor chip 3 is illustrated.

The sealing material 6 is put into the inside of the frame shape of the case 4 to seal the insulating substrate 2, the semiconductor chip 3, etc. The sealing material 6 is formed of an insulating material. The lid 7 is placed over the sealing material 6.

The plurality of attachment portions 8 are provided in order to attach the case 4 to a heat sink. In other words, the attachment portions 8 have a function of fixing the semiconductor device 100 to the heat sink. The attachment portion 8 in the first preferred embodiment includes the first through hole 81 provided in the base plate 1 and the second through hole 82 provided in the case 4. The attachment portions 8 are provided, in plan view, at four corners of each of the base plate 1 and the case 4. The later-described screw is inserted through the first through hole 81 and the second through hole 82.

Figure 4:
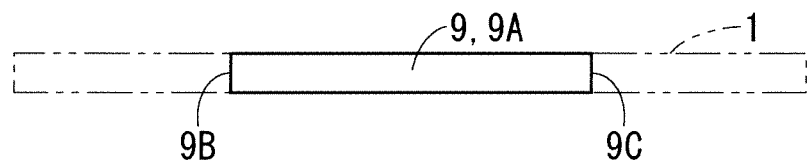
FIG. 4 is a cross-sectional view illustrating a configuration of a heat dissipation sheet in the first preferred embodiment.
Figure 5:
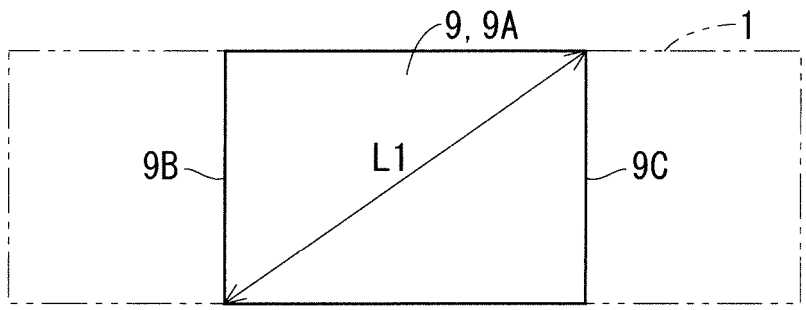
FIG. 5 is a bottom view illustrating the configuration of the heat dissipation sheet in the first preferred embodiment.

The heat dissipation member 9 is provided on the back surface of the base plate 1. The heat dissipation member 9 is provided to be capable of contacting the heat sink when the semiconductor device 100 is fixed to the heat sink. The heat dissipation member 9 in the first preferred embodiment is a heat dissipation sheet 9A. FIGS. 4 and 5 are cross-sectional and bottom views illustrating a configuration of the heat dissipation sheet 9A in the first preferred embodiment, respectively. In FIGS. 4 and 5, the shape of the base plate 1 is illustrated by broken lines.

Since the attachment portions 8 are provided at the four corners of the case 4, a shape defined by connecting, in plan view, the positions of the four attachment portions 8 is a rectangle. A direction extending along a long side of four sides that form the rectangle defined by the positions of the attachment portions 8 is a lateral direction (left-right direction) in FIG. 1. Ends 9B, 9C of the heat dissipation sheet 9A in the direction extending along the long side are located between the two attachment portions 8 that form the long side. In other words, the heat dissipation sheet 9A is provided inside the two attachment portions 8 that form the long side.

Figure 6:
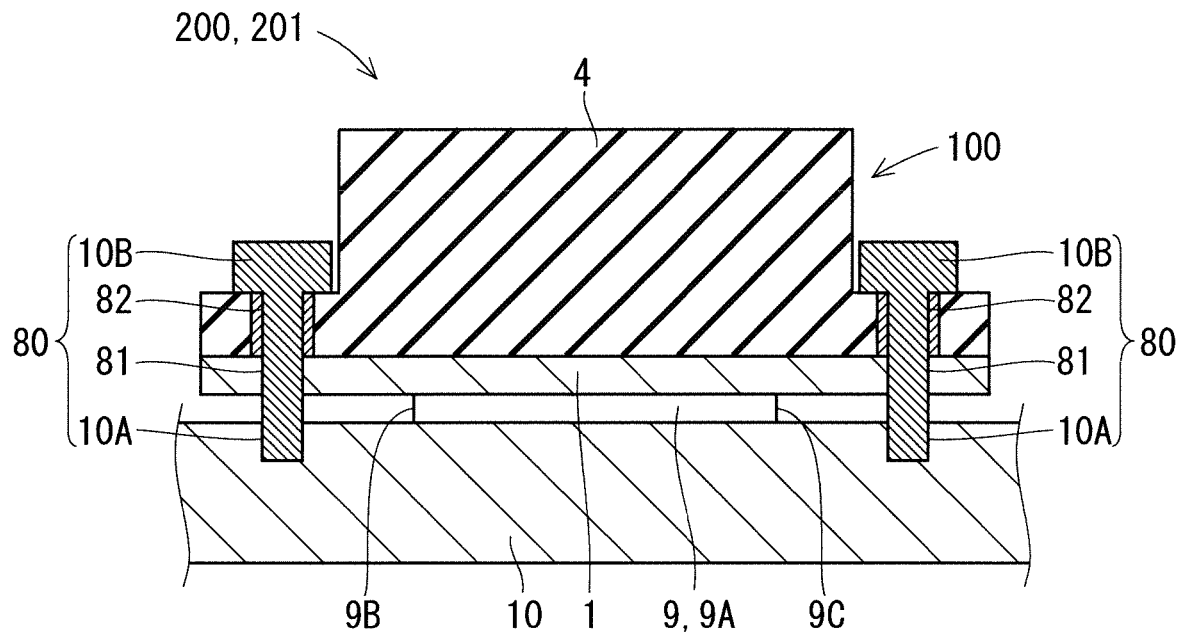
FIG. 6 is a cross-sectional view illustrating a configuration of a semiconductor module according to the first preferred embodiment.

FIG. 6 is a cross-sectional view illustrating a configuration of a semiconductor module 200 according to the first preferred embodiment. In FIG. 6, the internal configuration of the case 4 is not illustrated. The semiconductor module 200 includes the semiconductor device 100, a heat sink 10, and a plurality of fixing portions 80.

The heat sink 10 is in contact with the back surface of the base plate 1 via the heat dissipation sheet 9A. The heat sink 10 has a function of cooling the semiconductor chip 3 during the operation of the semiconductor device 100. In the heat sink 10 in the first preferred embodiment, screw holes 10A are provided at positions corresponding to the positions of the attachment portions 8 of the semiconductor device 100.

The fixing portion 80 includes the attachment portion 8 having the first through hole 81 and the second through hole 82, a screw 10B that is inserted through the attachment portion 8, and the screw hole 10A of the heat sink 10. The screw 10B and the screw hole 10A are tightened together. Thereby, the fixing portions 80 fix the case 4 to the heat sink 10 by applying stress, in a direction in which the heat sink 10 is provided, to the case 4.

Figure 7:
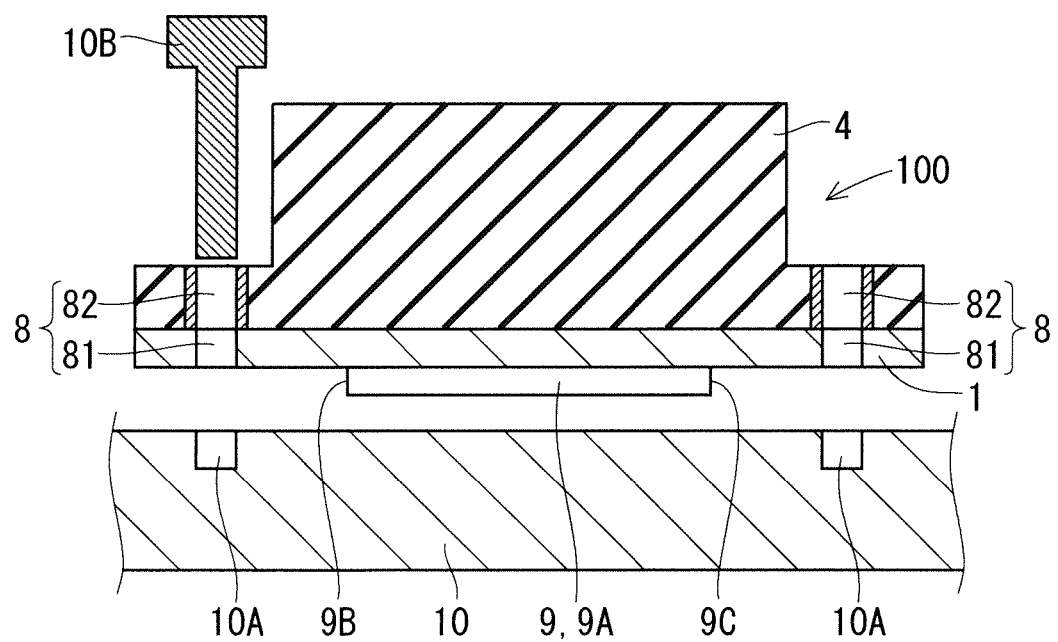
FIGS. 7, 8, and 9 are views each illustrating an outline of a manufacturing step of the semiconductor module according to the first preferred embodiment.
Figure 8:
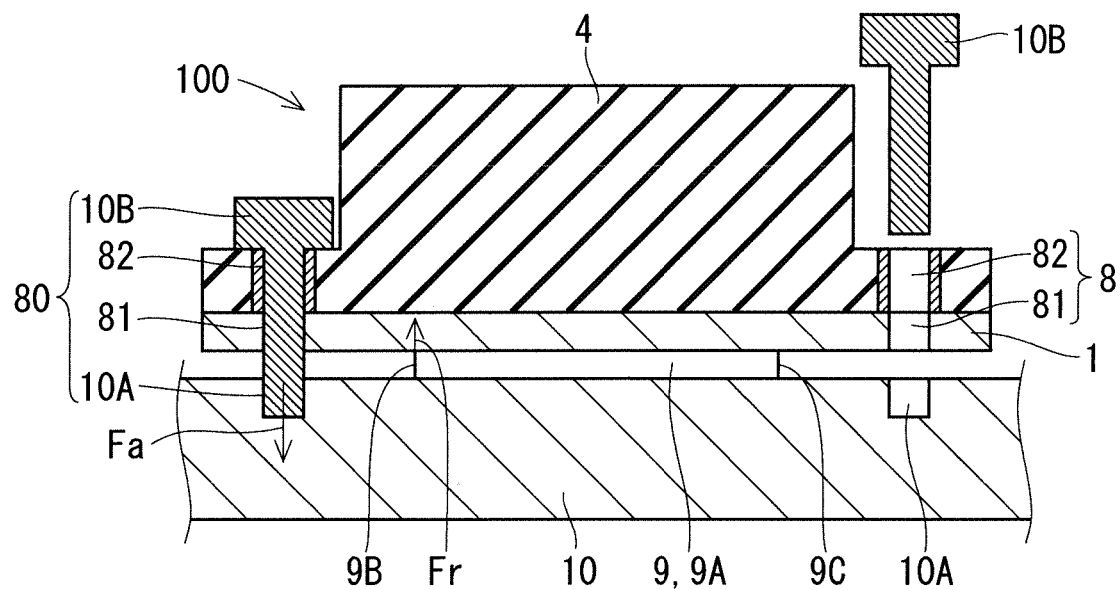
Figure 9:
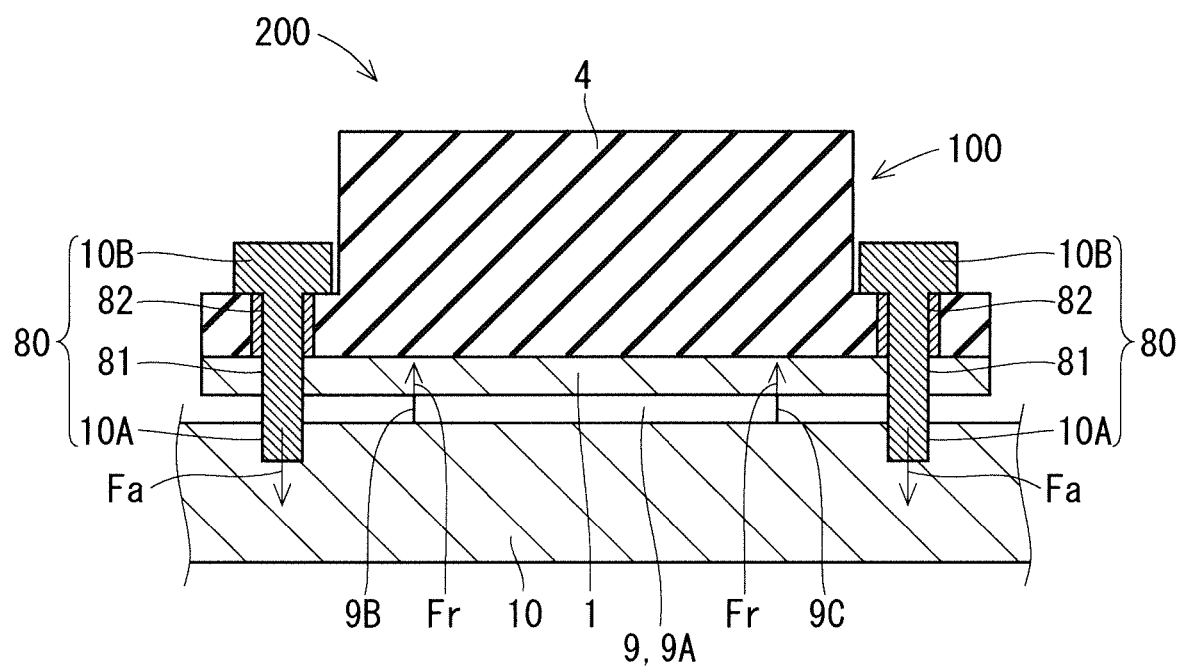

FIGS. 7 to 9 are views each illustrating an outline of a manufacturing step of the semiconductor module 200 according to the first preferred embodiment. First, the semiconductor device 100 is placed at a predetermined position on the heat sink 10. Specifically, the attachment portions 8 of the semiconductor device 100 are arranged such that their positions match the positions of the screw holes 10A of the heat sink 10 (FIG. 7). The screw 10B inserted through the attachment portion 8 on the left side and the screw hole 10A of the heat sink 10 are tightened together (FIG. 8). Thereby, an axial force Fa is generated in the direction of from the case 4 to the heat sink 10, and a reaction force Fr is generated in the direction of from the heat sink 10 to the case 4. The axial force Fa is generated in the attachment portion 8 on the left side. Since the reaction force Fr is transmitted to the base plate 1 via the heat dissipation sheet 9A that is in contact with the heat sink 10, the reaction force Fr is generated at the end 9B of the heat dissipation sheet 9A close to the attachment portion 8 on the left side. Further, the screw 10B inserted through the attachment portion 8 on the right side and the screw hole 10A are tightened together (FIG. 9). As a result, an axial force Fa is generated in the attachment portion 8 on the right side, and a reaction force Fr is generated at the end 9C of the heat dissipation sheet 9A close to the attachment portion 8 on the right side. When the distance between the positions at each of which the reaction force Fr is generated is defined as an inter-reaction force distance, an inter-reaction force distance L1 in the first preferred embodiment corresponds to the diagonal distance of the heat dissipation sheet 9A, as illustrated in FIG. 5.

Figure 10:
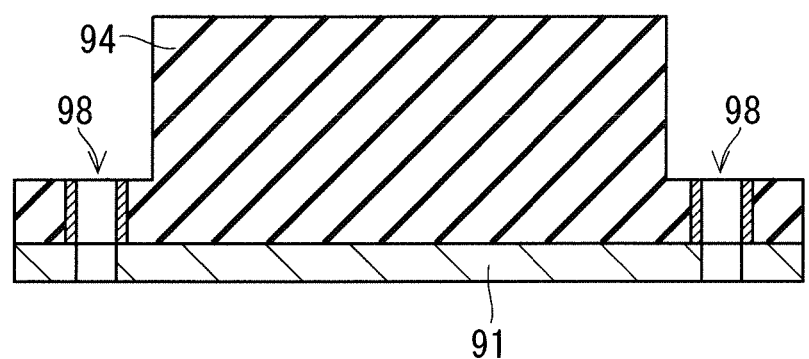
FIG. 10 is a cross-sectional view illustrating configurations of a case and a base plate in a comparative structure in the first preferred embodiment.
Figure 11:
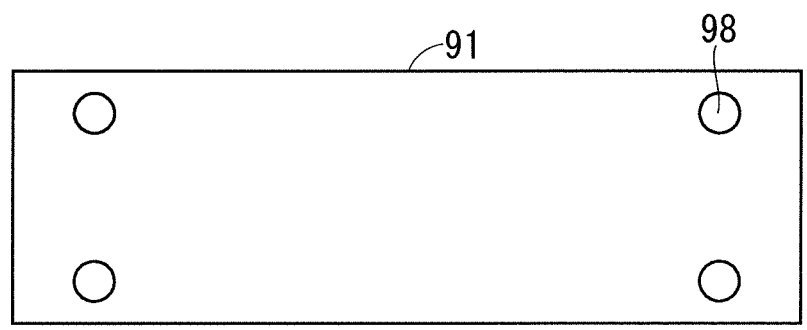
FIG. 11 is a bottom view illustrating the configuration of the base plate in the comparative structure in the first preferred embodiment.
Figure 12:
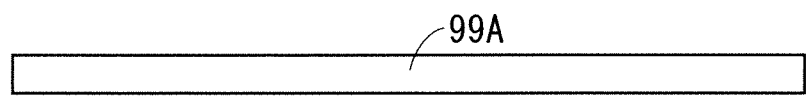
FIG. 12 is a cross-sectional view illustrating a configuration of a heat dissipation sheet in the comparative structure in the first preferred embodiment.
Figure 13:
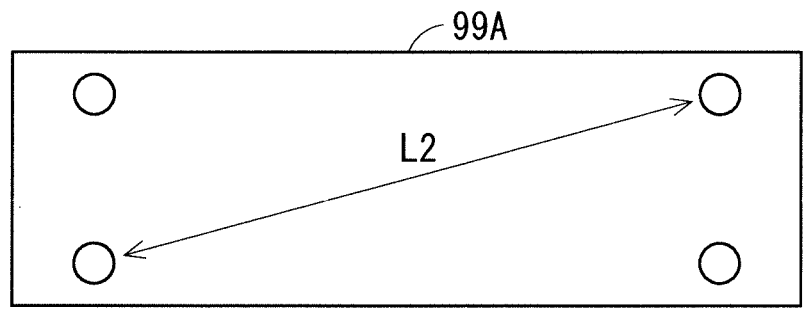
FIG. 13 is a bottom view illustrating the configuration of the heat dissipation sheet in the comparative structure in the first preferred embodiment.

Next, a structure in a case where the ends 9B, 9C of the heat dissipation sheet 9A in a direction extending along a long side of a rectangle defined by connecting the positions of the four attachment portions 8 are located outside the two attachment portions 8 that form the long side, will be described. Here, the structure is referred to as a comparative structure. FIG. 10 is a cross-sectional view illustrating configurations of a case 94 and a base plate 91 in the comparative structure in the first preferred embodiment. In FIG. 10, an internal configuration of the case 94 is not illustrated. FIG. 11 is a bottom view illustrating the configuration of the base plate 91 in the comparative structure in the first preferred embodiment. FIGS. 12 and 13 are cross-sectional and bottom views each illustrating a configuration of a heat dissipation sheet 99A included in the comparative structure in the first preferred embodiment, respectively. The heat dissipation sheet 99A has the same shape as the back surface of the case 94 and the base plate 91, and is provided with through holes corresponding to the attachment portions 98.

Figure 14:
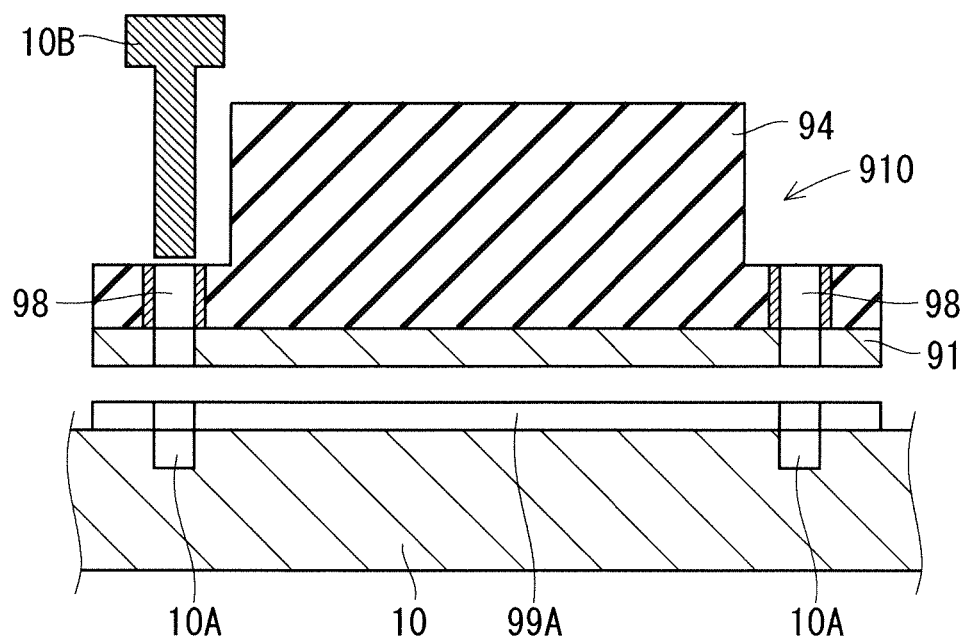
FIGS. 14, 15, and 16 are views each illustrating an outline of a step of attaching a semiconductor device in the comparative structure in the first preferred embodiment to a heat sink.
Figure 15:
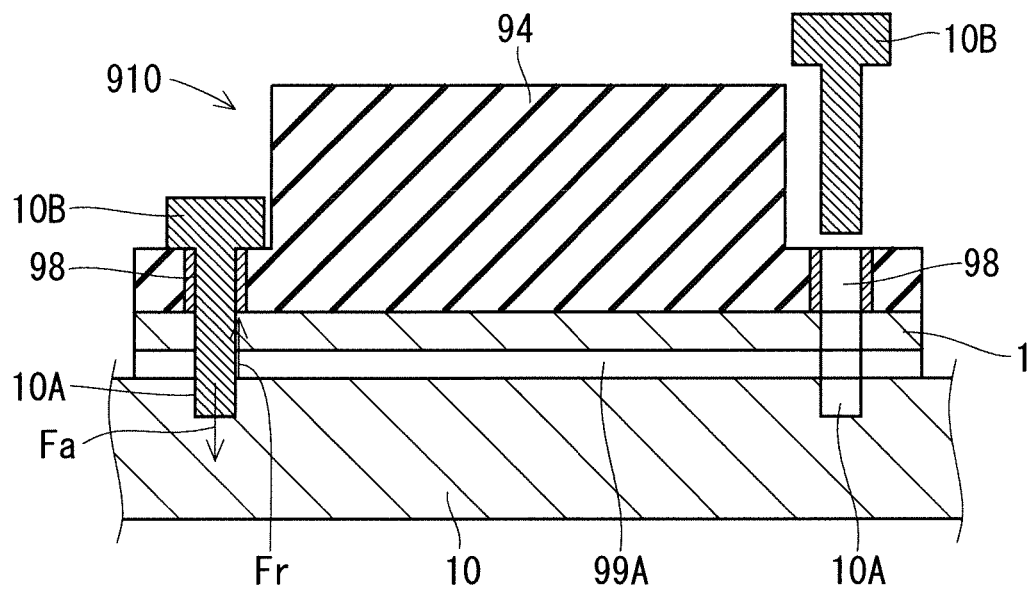
Figure 16:
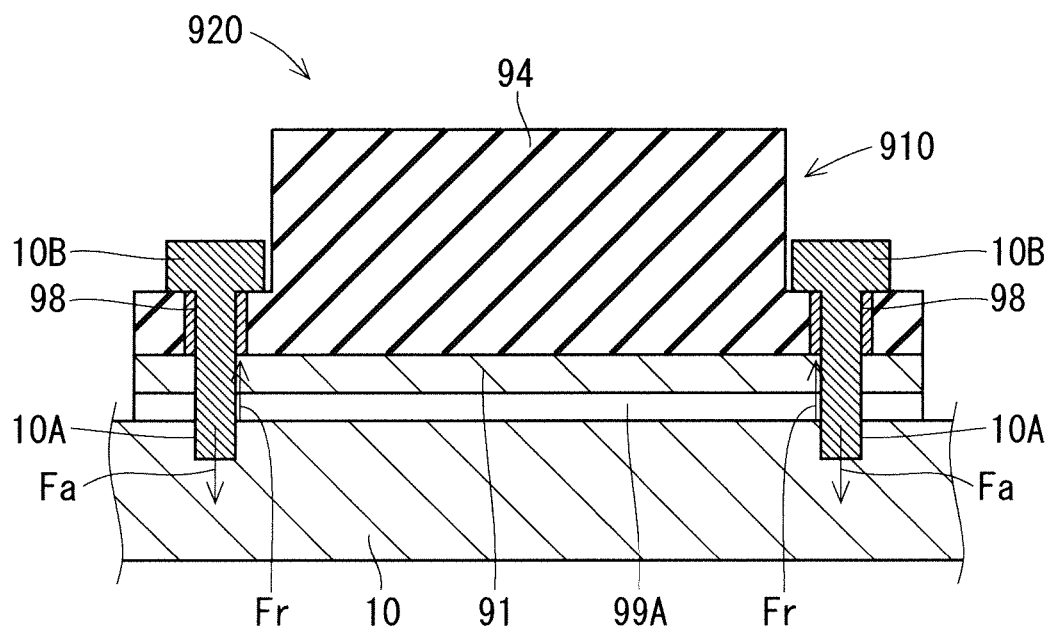

FIGS. 14 to 16 are views each illustrating an outline of a step of attaching a semiconductor device 910 to the heat sink 10. The semiconductor device 910 has the comparative structure in the first preferred embodiment. First, the heat dissipation sheet 99A is placed on the heat sink 10. Next, the attachment portions 98 of the semiconductor device 910 are arranged such that their positions match the positions of the screw holes 10A of the heat sink 10 (FIG. 14). The screw 10B inserted through the attachment portion 98 on the left side and the screw hole 10A of the heat sink 10 are tightened together (FIG. 15). An axial force Fa is generated in the attachment portion 98 on the left side. A reaction force Fr is generated at a position close to the attachment portion 98 on the left side. Further, the screw 10B inserted through the attachment portion 98 on the right side and the screw hole 10A are tightened together (FIG. 16). As a result, an axial force Fa is generated in the attachment portion 98 on the right side, and a reaction force Fr is generated at a position close to the attachment portion 98 on the right side. Therefore, an inter-reaction force distance L2 in the comparative structure corresponds to the distance between the attachment portions 98 located diagonally to each other, as illustrated in FIG. 13. In such a state, the base plate 91 easily bends in a concave shape with respect to the heat sink 10. When the base plate 91 bends in a concave shape, a gap between the base plate 91 and the heat dissipation sheet 99A is caused, for example, in the central portion of the base plate 91. Therefore, the heat dissipation of a semiconductor module 920 deteriorates.

On the other hand, the inter-reaction force distance L1 in the semiconductor module 200 according to the first preferred embodiment is smaller than the inter-reaction force distance L2 in the comparative structure. Therefore, the bending of the base plate 1 is reduced or prevented. In other words, the contact between the base plate 1 and the heat dissipation sheet 9A or the contact between the heat dissipation sheet 9A and the heat sink is improved, so that the heat dissipation of the semiconductor module 200 is improved.

To summarize the above, the semiconductor device 100 according to the first preferred embodiment includes the base plate 1, the semiconductor chip 3, the case 4, the heat dissipation member 9, and the plurality of attachment portions 8. The semiconductor chip 3 is held on the front surface side of the base plate 1. The case 4 is provided on the front surface of the base plate 1 so as to house the semiconductor chip 3 inside. The heat dissipation member 9 is provided on the back surface of the base plate 1 and contactable with the heat sink 10 for cooling the semiconductor chip 3. The plurality of attachment portions 8 have a function of attaching the case 4 to the heat sink 10. The ends 9B, 9C of the heat dissipation member 9 in a direction extending along a long side of a plurality of sides that form a shape defined by connecting positions of the plurality of attachment portions 8 in plan view are located between the two attachment portions 8 that form the long side.

With such a configuration, the heat radiation to the heat sink 10 via the heat dissipation sheet 9A is improved. Therefore, unlike the conventional cases, it is not necessary to change the specification of the case 4, such as adjusting the positions of the attachment portions 8 in order to prevent a drop in surface pressure onto the heat dissipation sheet 9A. Only by changing the configuration of the heat dissipation sheet 9A, the surface pressure onto the heat dissipation sheet 9A is ensured. As a result, the heat dissipation of the semiconductor device 100 is improved. Further, with such a configuration, a degree of freedom in designing the structure of the case 4 is ensured, so that the semiconductor device 100 can be reduced in size. Furthermore, a rise in the internal temperature during the operation of the semiconductor device 100 can be prevented, so that reliability for power cycle, etc., is improved. Such a semiconductor device 100 is used in, for example, a power generation system, a power transmission system, an efficient energy utilization system, an energy regeneration system, etc.

In the heat dissipation sheet 9A in the first preferred embodiment, an area of a portion in contact with the base plate 1 is made smaller than that of the heat dissipation sheet 99A in the comparative structure. Therefore, in a region where the heat dissipation sheet 9A is not in contact with the base plate 1, a heat dissipation effect is not obtained. However, the region is an outer peripheral portion of the semiconductor device 100, and is away from the central portion where heat generation is concentrated. Therefore, in the semiconductor device 100, an improvement in the heat dissipation due to the improvement in the surface pressure onto the heat dissipation sheet 9A in the central portion becomes dominant.

Additionally, in the first preferred embodiment, the semiconductor chip 3 is mounted on the insulating substrate 2 joined to the base plate 1, but a form of mounting the semiconductor chip 3 is not limited thereto. For example, the insulating layer 2A and the circuit pattern 2B may be integrally formed on the front surface of the base plate 1, and the semiconductor chip 3 may be mounted on the circuit pattern 2B. In such a configuration, the function of the insulating substrate 2 is integrated with the base plate 1, and hence heat dissipation is improved and cost is reduced.

The heat dissipation member 9 is not limited to the heat dissipation sheet 9A, and may be heat dissipation grease, etc. When the heat dissipation sheet 9A is less likely to deform than heat dissipation grease, the heat dissipation sheet 9A is effective.

The base plate 1 may be thicker in the central portion than in the outer peripheral portion. In such a configuration, even if the base plate 1 bends in a concave shape with respect to the heat sink 10, the contact between the base plate 1 and the heat dissipation sheet 9A or the contact between the heat dissipation sheet 9A and the heat sink is maintained, so that the heat dissipation of the semiconductor module 200 is ensured.

Modification of First Preferred Embodiment

Figure 17:
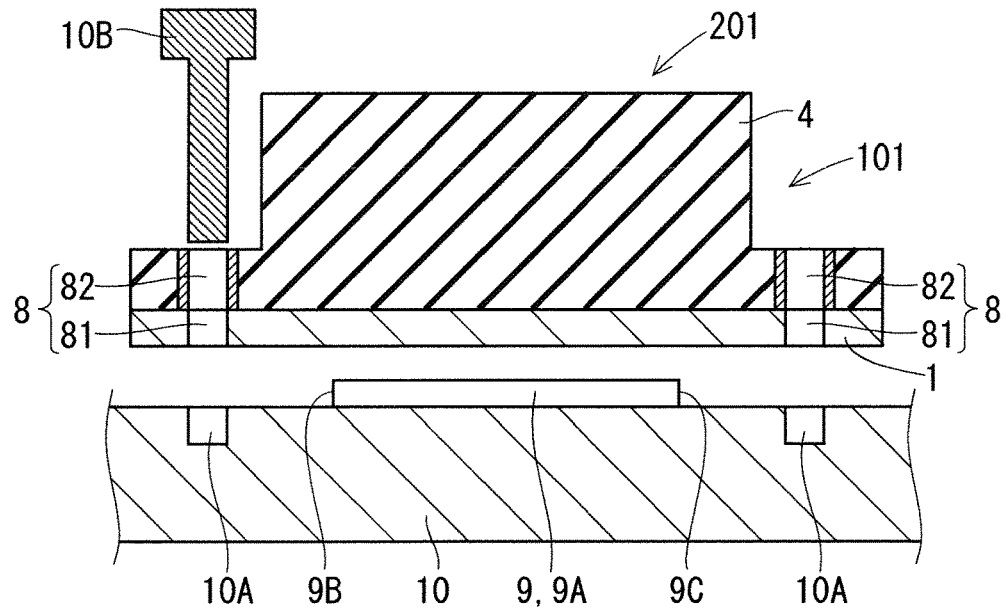
FIG. 17 is a view illustrating an outline of a manufacturing step of a semiconductor module according to a modification of the first preferred embodiment.

A semiconductor module 201 according to a modification of the first preferred embodiment is the same as the semiconductor module 200 illustrated in FIG. 6. However, its manufacturing steps are different. FIG. 17 is a view illustrating an outline of a manufacturing step of the semiconductor module 201 according to the modification of the first preferred embodiment. The heat dissipation sheet 9A is not provided in advance in a semiconductor device 101. In the manufacturing step of the semiconductor module 201, the heat dissipation sheet 9A is first placed on the heat sink 10. The shape and position of the heat dissipation sheet 9A are the same as those in the first preferred embodiment. The semiconductor device 101 is placed on the heat dissipation sheet 9A. The screw 10B inserted through the attachment portion 8 and the screw hole 10A are tightened together. The semiconductor module 201 formed in this way also has the same effects as those of the first preferred embodiment.

Second Preferred Embodiment

A semiconductor device and a semiconductor module according to a second preferred embodiment will be described. The second preferred embodiment is a subordinate concept of the first preferred embodiment, and the semiconductor device and the semiconductor module according to the second preferred embodiment include the configurations of the semiconductor device 100 and the semiconductor module 200 according to the first preferred embodiment, respectively. Note that description of the same configurations and operations as those in the first preferred embodiment will be omitted.

Figure 18:
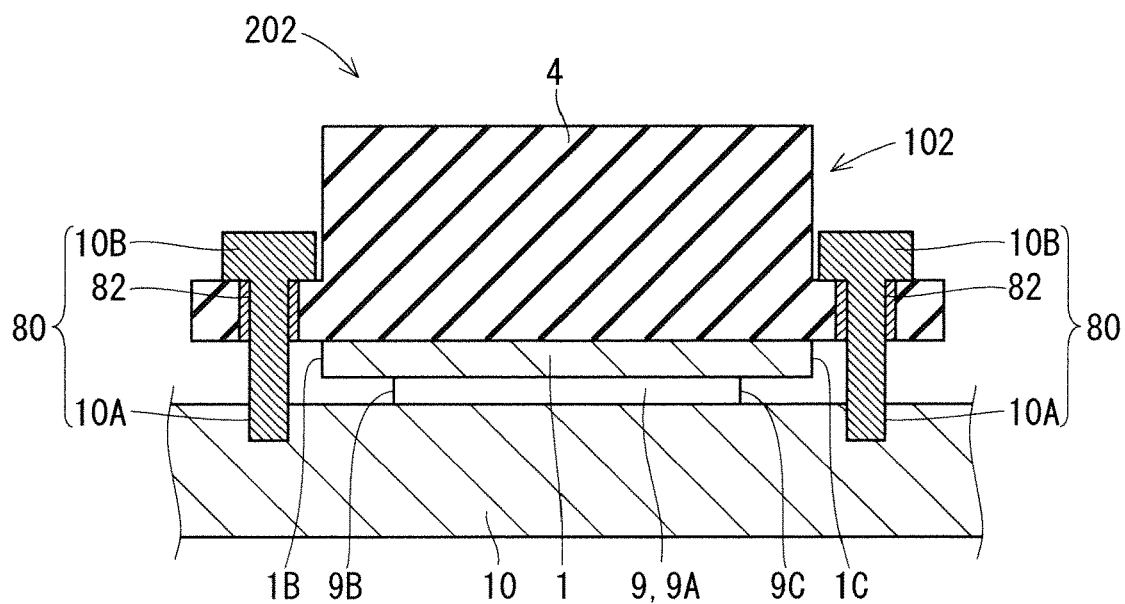
FIG. 18 is a cross-sectional view illustrating a configuration of a semiconductor module according to a second preferred embodiment.
Figure 19:
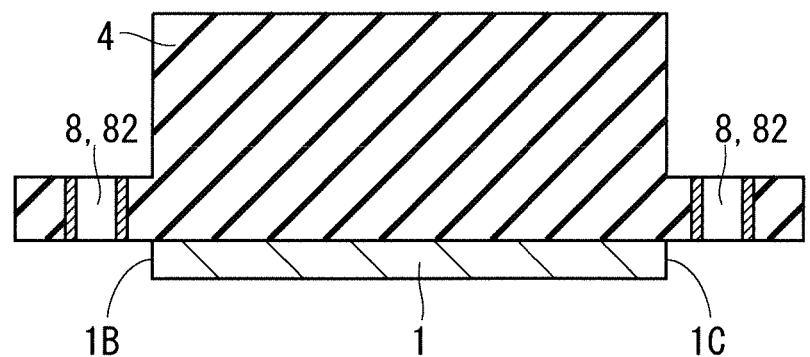
FIG. 19 is a cross-sectional view illustrating configurations of a case and a base plate of a semiconductor device according to the second preferred embodiment.
Figure 20:
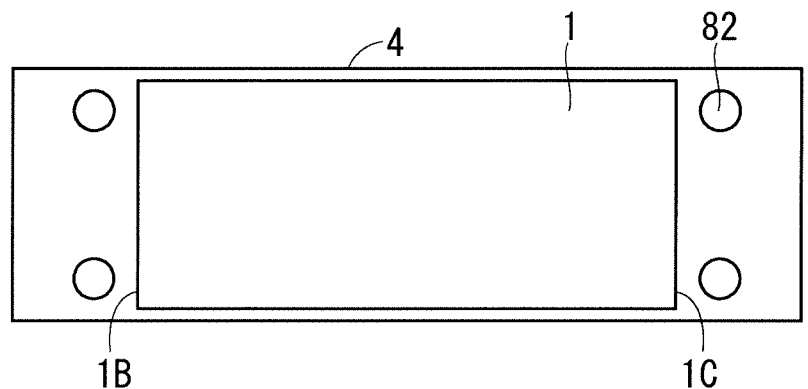
FIG. 20 is a bottom view illustrating the configurations of the case and the base plate of the semiconductor device according to the second preferred embodiment.

FIG. 18 is a cross-sectional view illustrating a configuration of a semiconductor module 202 according to the second preferred embodiment. FIGS. 19 and 20 are respectively cross-sectional and bottom views each illustrating configurations of a case 4 and a base plate 1 of a semiconductor device 102 according to the second preferred embodiment. In FIGS. 18 and 19, an internal configuration of the case 4 is not illustrated.

In the second preferred embodiment, the configuration of the base plate 1 is different from that in the first preferred embodiment. Also in the second preferred embodiment, attachment portions 8 (second through holes 82) are provided at the respective four corners of the case 4, and hence a shape defined by connecting, in plan view, the positions of the four attachment portions 8 is a rectangle. A direction extending along a long side of four sides that form the rectangle is a lateral direction (left-right direction) in FIG. 18. The base plate 1 is provided, in the direction extending along the long side of the rectangle, inside the plurality of attachment portions 8. In other words, the base plate 1 is not provided immediately below the second through holes 82 of the case 4. Therefore, a fixing portion 80 of the semiconductor module 202 is formed by the attachment portion 8 including the second through hole 82, a screw 10B, and a screw hole 10A, as illustrated in FIG. 18.

Figure 21:
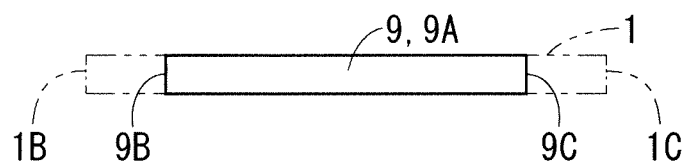
FIG. 21 is a cross-sectional view illustrating a configuration of a heat dissipation sheet in the second preferred embodiment.
Figure 22:
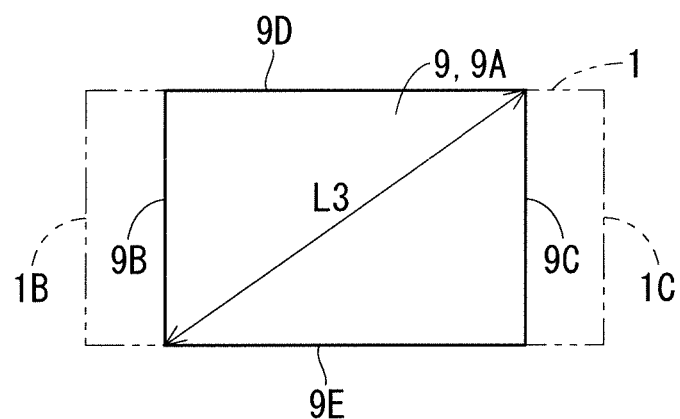
FIG. 22 is a bottom view illustrating the configuration of the heat dissipation sheet in the second preferred embodiment.

FIGS. 21 and 22 are respectively cross-sectional and bottom views each illustrating a configuration of a heat dissipation sheet 9A in the second preferred embodiment. In FIGS. 21 and 22, the size of the base plate 1 is illustrated by dotted lines.

Ends 9B, 9C of the heat dissipation sheet 9A in the direction extending along the long side are located inside ends 1B, 1C of the base plate 1. Further, ends 9D, 9E of the heat dissipation sheet 9A in a direction extending along a side different from the long side, that is, a short side (longitudinal direction in FIGS. 20 and 22) are located on the long side or on an outer peripheral side, beyond the long side, of the case 4.

Figure 23:
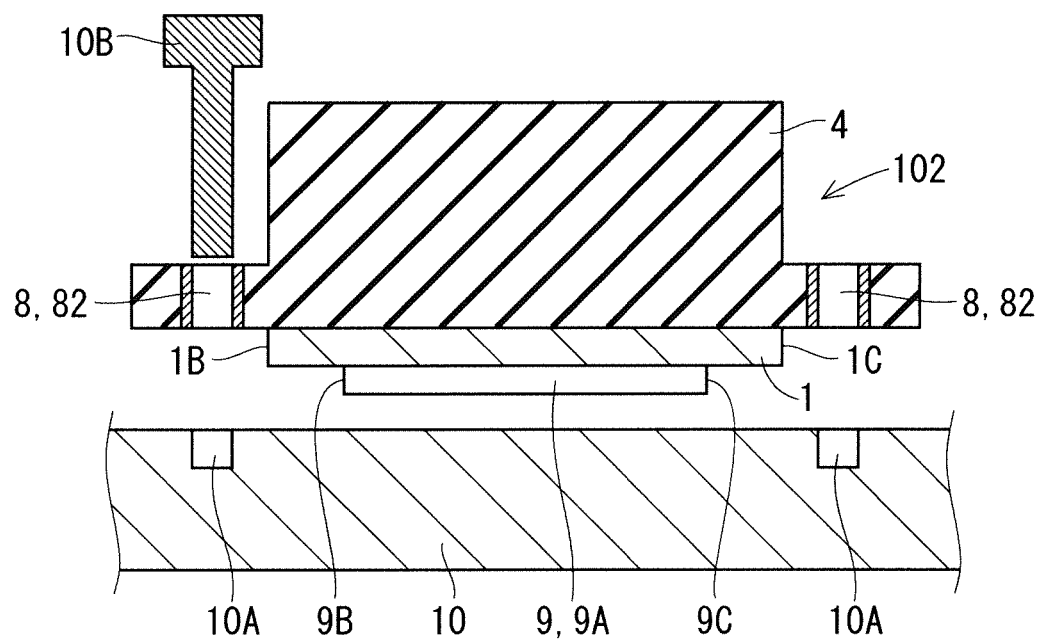
FIGS. 23, 24, and 25 are views each illustrating an outline of a manufacturing step of the semiconductor module according to the second preferred embodiment.
Figure 24:
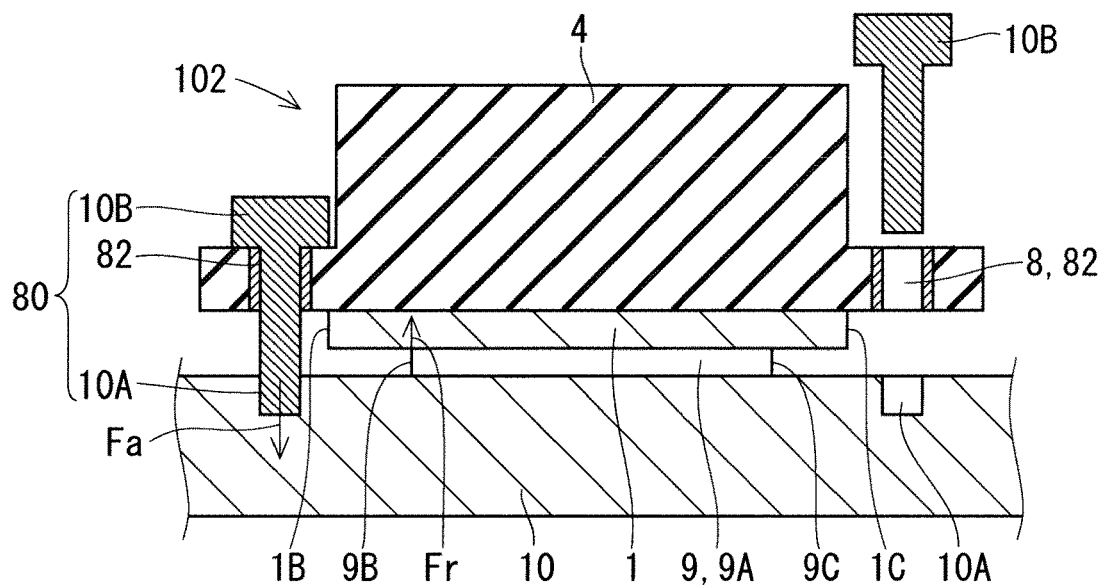
Figure 25:
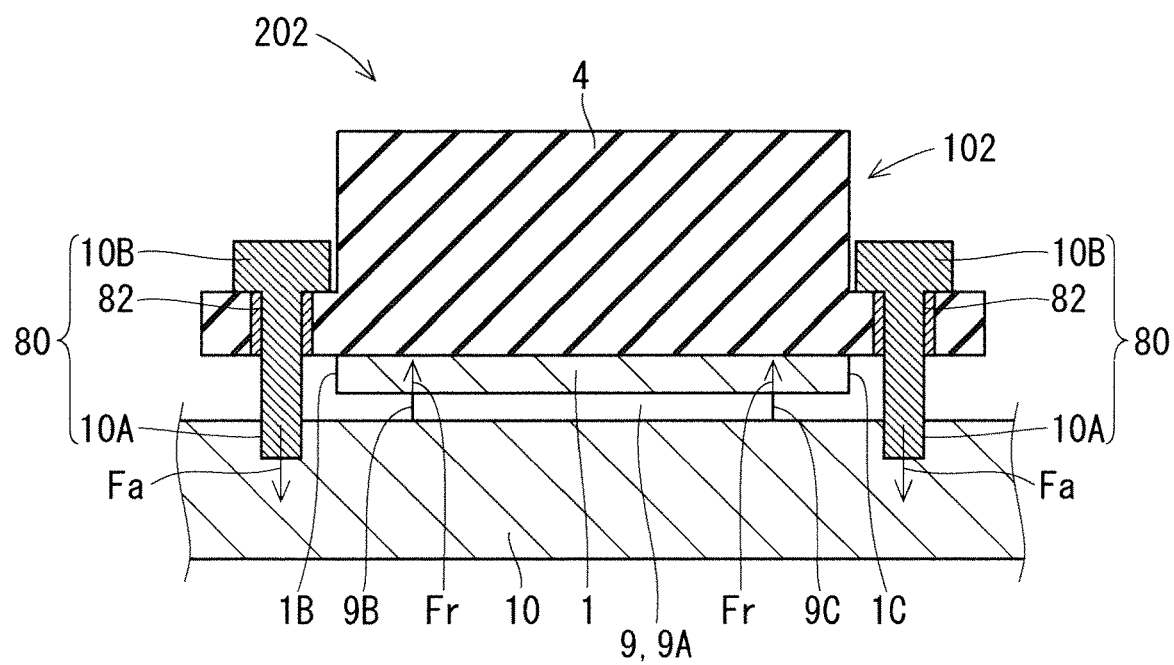

FIGS. 23 to 25 are views each illustrating an outline of a manufacturing step of the semiconductor module 202 according to the second preferred embodiment. First, the semiconductor device 102 is placed at a predetermined position on a heat sink 10. Specifically, the attachment portions 8 of the semiconductor device 102 are arranged such that their positions match the positions of the screw holes 10A of the heat sink 10 (FIG. 23). The screw 10B inserted through the attachment portion 8 on the left side and the screw hole 10A of the heat sink 10 are tightened together (FIG. 24). Thereby, an axial force Fa is generated in the direction of from the case 4 to the heat sink 10, and a reaction force Fr is generated in the direction of from the heat sink 10 to the case 4. The axial force Fa is generated in the attachment portion 8 on the left side. The reaction force Fr is generated at the end 9B of the heat dissipation sheet 9A close to the attachment portion 8 on the left side. Further, the screw 10B inserted through the attachment portion 8 on the right side and the screw hole 10A are tightened together (FIG. 25). As a result, an axial force Fa is generated in the attachment portion 8 on the right side, and a reaction force Fr is generated at the end 9C of the heat dissipation sheet 9A close to the attachment portion 8 on the right side. As illustrated in FIG. 22, an inter-reaction force distance L3 in the second preferred embodiment corresponds to the diagonal distance of the heat dissipation sheet 9A.

Figure 26:
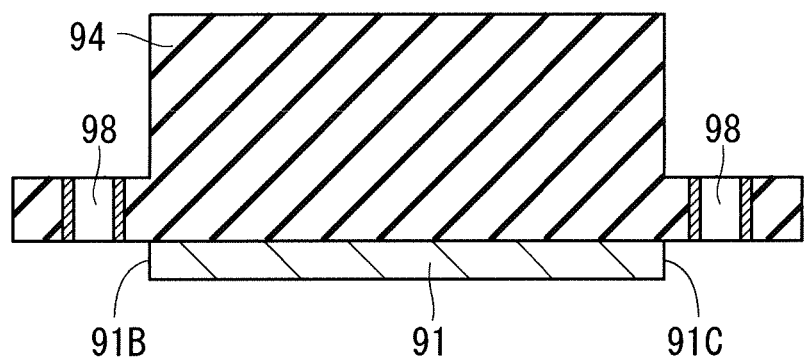
FIG. 26 is a cross-sectional view illustrating configurations of a case and a base plate in a comparative structure in the second preferred embodiment.
Figure 27:
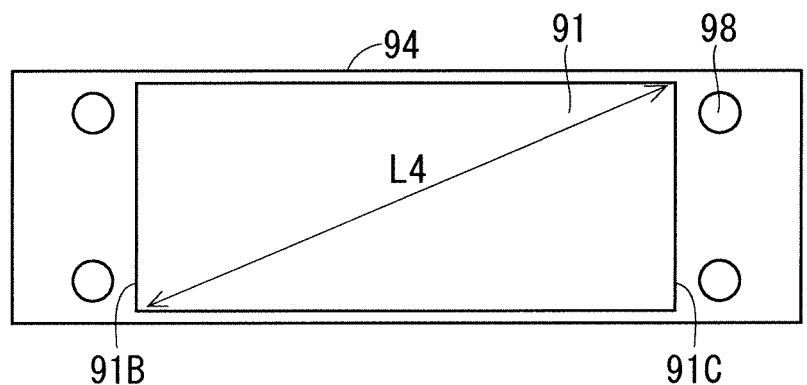
FIG. 27 is a bottom view illustrating the configurations of the case and the base plate in the comparative structure in the second preferred embodiment.
Figure 28:
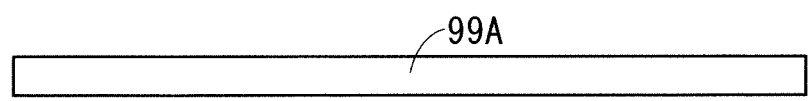
FIG. 28 is a cross-sectional view illustrating a configuration of a heat dissipation sheet in the comparative structure in the second preferred embodiment.
Figure 29:
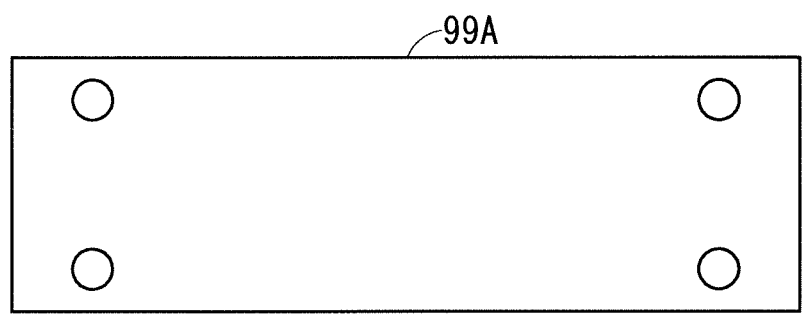
FIG. 29 is a bottom view illustrating the configuration of the heat dissipation sheet in the comparative structure in the second preferred embodiment.

Next, a structure in a case where the ends 9B, 9C of the heat dissipation sheet 9A in a direction extending along a long side of a rectangle defined by connecting the positions of the four attachment portions 8 are located outside the two attachment portions 8 that form the long side, will be described. Here, the structure is referred to as a comparative structure. FIG. 26 is a cross-sectional view illustrating configurations of a case 94 and a base plate 91 in the comparative structure in the second preferred embodiment. In FIG. 26, an internal configuration of the case 94 is not illustrated. FIG. 27 is a bottom view illustrating the configuration of the case 94 and the base plate 91 in the comparative structure in the second preferred embodiment. FIGS. 28 and 29 are respectively cross-sectional and bottom views each illustrating a configuration of a heat dissipation sheet 99A included in the comparative structure in the second preferred embodiment. The heat dissipation sheet 99A has the same shape as the bottom surface of the case 94, and is provided with through holes corresponding to the attachment portions 98.

Figure 30:
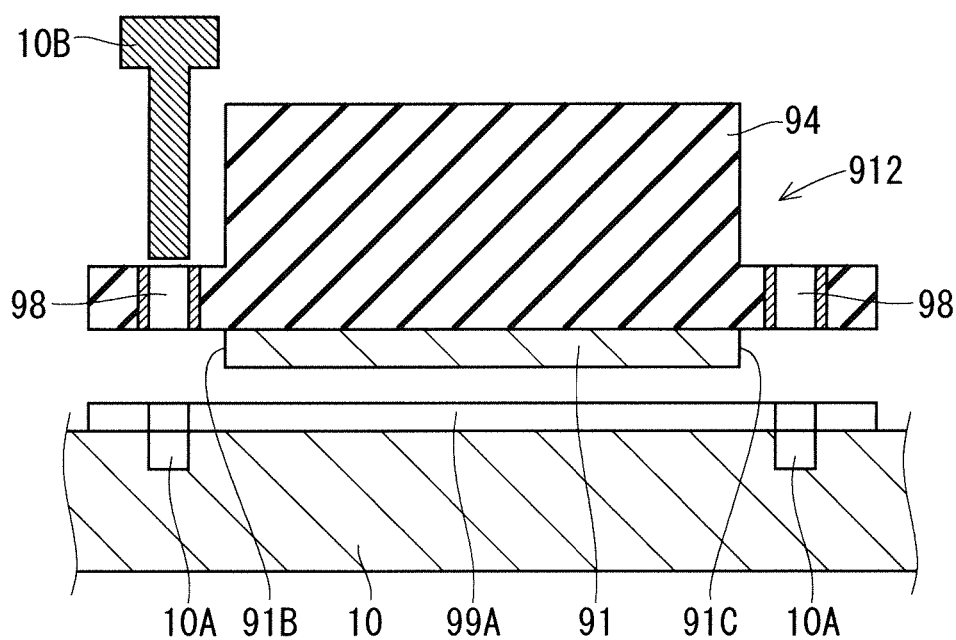
FIGS. 30, 31, and 32 are views each illustrating an outline of a step of attaching a semiconductor device in the comparative structure in the second preferred embodiment to a heat sink.
Figure 31:
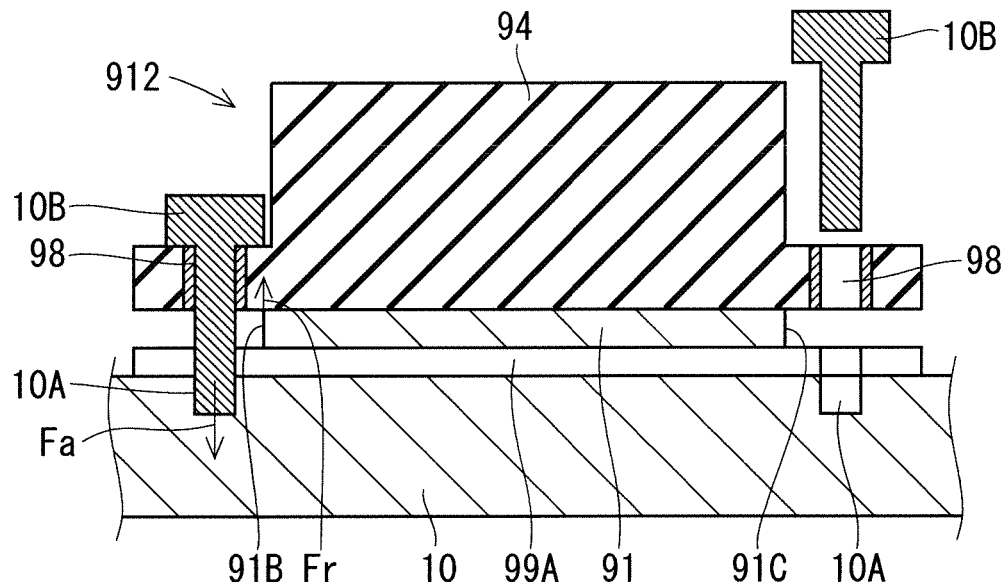
Figure 32:
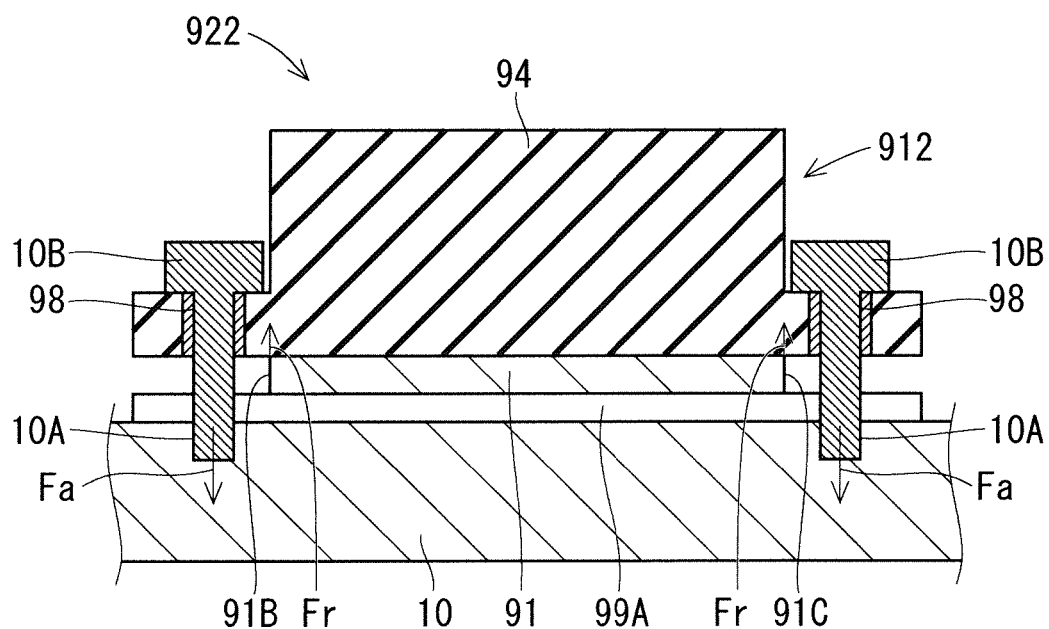

FIGS. 30 to 32 are views each illustrating an outline of a step of attaching a semiconductor device 912 to the heat sink 10. The semiconductor device 912 has the comparative structure in the second preferred embodiment. First, the heat dissipation sheet 99A is placed on the heat sink 10. Next, the attachment portions 98 of the semiconductor device 912 are arranged such that their positions match the positions of the screw holes 10A of the heat sink 10 (FIG. 30). The screw 10B inserted through the attachment portion 98 on the left side and the screw hole 10A of the heat sink 10 are tightened together (FIG. 31). An axial force Fa is generated in the attachment portion 98 on the left side. A reaction force Fr is generated at an end 91B of the base plate 91 close to the attachment portion 98 on the left side. Further, the screw 10B inserted through the attachment portion 98 on the right side and the screw hole 10A are tightened together (FIG. 32). As a result, an axial force Fa is generated in the attachment portion 98 on the right side, and a reaction force Fr is generated at an end 91C of the base plate 91 close to the attachment portion 98 on the right side. Therefore, an inter-reaction force distance L4 in the comparative structure corresponds to the diagonal distance of the base plate 91, as illustrated in FIG. 27. In such a state, the base plate 91 easily bends in a concave shape with respect to the heat sink 10. When the base plate 91 bends in a concave shape, a gap between the base plate 91 and the heat dissipation sheet 99A is caused, for example, in the central portion of the base plate 91. Therefore, the heat dissipation of a semiconductor module 922 deteriorates.

The inter-reaction force distance L3 in the semiconductor module 202 according to the second preferred embodiment is smaller than the inter-reaction force distance L4 in the comparative structure. Therefore, the bending of the base plate 1 is reduced or prevented. In other words, the contact between the base plate 1 and the heat dissipation sheet 9A or the contact between the heat dissipation sheet 9A and the heat sink is improved, so that the heat dissipation of the semiconductor module 202 is improved. The semiconductor device 102 and the semiconductor module 202 according to the second preferred embodiment have the same effects as those of the first preferred embodiment.

Third Preferred Embodiment

A semiconductor device and a semiconductor module according to a third preferred embodiment will be described. The third preferred embodiment is a subordinate concept of the first preferred embodiment, and the semiconductor device and the semiconductor module according to the third preferred embodiment include the configurations of the semiconductor device 100 and the semiconductor module 200 according to the first preferred embodiment, respectively. Note that description of the same configurations and operations as those in the first preferred embodiment or the second preferred embodiment will be omitted.

In the semiconductor modules 200, 201, 202 described in the first and second preferred embodiments, the fixing portion 80 applies stress, in the direction in which the heat sink 10 is provided, to the case 4. That is, the heat dissipation sheet 9A is held between the heat sink 10 and the base plate 1, while receiving compressive stress between the two. It is preferable that the film thickness of the heat dissipation sheet 9A is 200 µm or less in the compressed state.

When compressive stress is applied to the heat dissipation sheet 9A, the larger the film thickness of the heat dissipation sheet 9A, the greater an amount of bending of the base plate 1. However, when the film thickness of the heat dissipation sheet 9A is 200 µm or less in the compressed state, the bending of the base plate 1 is reduced. Therefore, a drop in surface pressure onto to the heat dissipation sheet 9A in the central portion of the base plate 1 is prevented, so that the heat dissipation of the semiconductor modules 200, 201, 202 is improved.

Fourth Preferred Embodiment

A semiconductor device and a semiconductor module according to a fourth preferred embodiment will be described. The fourth preferred embodiment is a subordinate concept of the first preferred embodiment, and the semiconductor device and the semiconductor module according to the fourth preferred embodiment include the configurations of the semiconductor device 100 and the semiconductor module 200 according to the first preferred embodiment, respectively. Note that description of the same configurations and operations as those in any one of the first through third preferred embodiments will be omitted.

Figure 33:
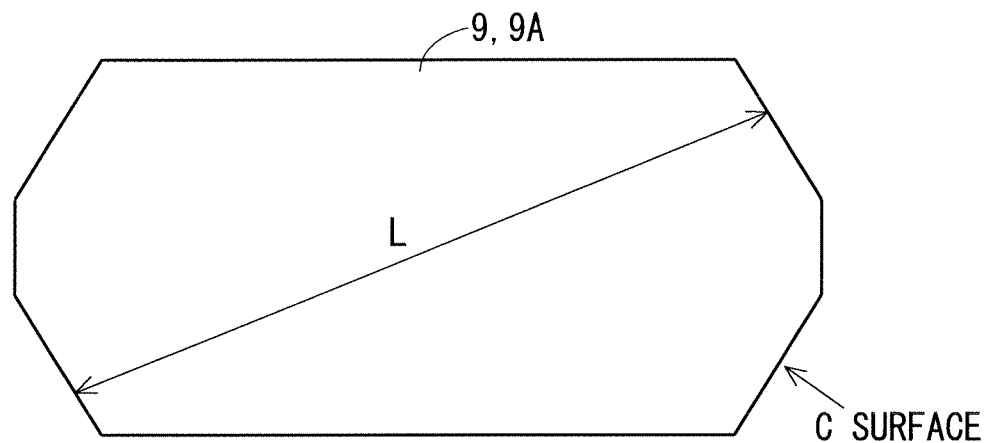
FIG. 33 is a plan view illustrating a configuration of a heat dissipation sheet in a fourth preferred embodiment.

A heat dissipation sheet 9A in the fourth preferred embodiment has an outer shape whose at least one corner is chamfered in plan view. Of a plurality of corners that form the planar shape of the heat dissipation sheet 9A, the corner to be chamfered is preferably a corner close to the attachment portion 8. FIG. 33 is a plan view illustrating a configuration of the heat dissipation sheet 9A in the fourth preferred embodiment. The heat dissipation sheet 9A is provided with C-surfaces (45-degree surfaces) at the four corners of the rectangle.

With such a configuration, an inter-reaction force distance L is reduced while a reduction amount of the area of the heat dissipation sheet 9A is being suppressed. Therefore, the contact areas between the heat dissipation sheet 9A and the base plate 1 and between the heat dissipation sheet 9A and the heat sink 10 are ensured. In other words, surface pressure onto the heat dissipation sheet 9A is ensured. As a result, the heat dissipation of the semiconductor module is improved.

Fifth Preferred Embodiment

A semiconductor device and a semiconductor module according to a fifth preferred embodiment will be described. The fifth preferred embodiment is a subordinate concept of the first preferred embodiment, and the semiconductor device and the semiconductor module according to the fifth preferred embodiment include the configurations of the semiconductor device 100 and the semiconductor module 200 according to the first preferred embodiment, respectively. Note that description of the same configurations and operations as those in any one of the first through fourth preferred embodiments will be omitted.

Figure 34:
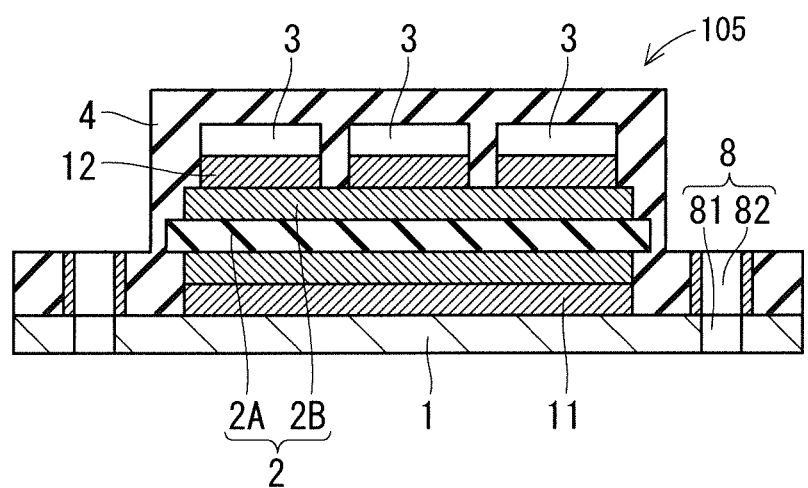
FIG. 34 is a cross-sectional view illustrating a configuration of a semiconductor device according to a fifth preferred embodiment.
Figure 35:
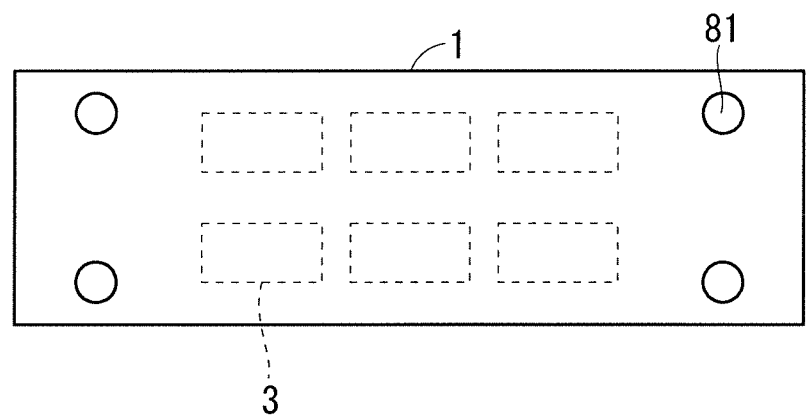
FIG. 35 is a bottom view illustrating a configuration of a base plate in the fifth preferred embodiment.
Figure 36:
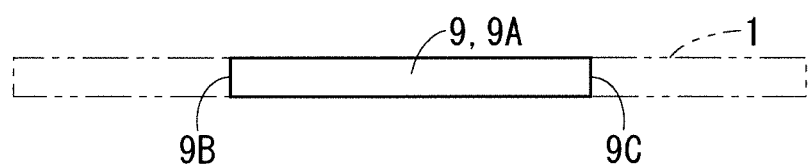
FIG. 36 is a cross-sectional view illustrating a configuration of a heat dissipation sheet in the fifth preferred embodiment.
Figure 37:
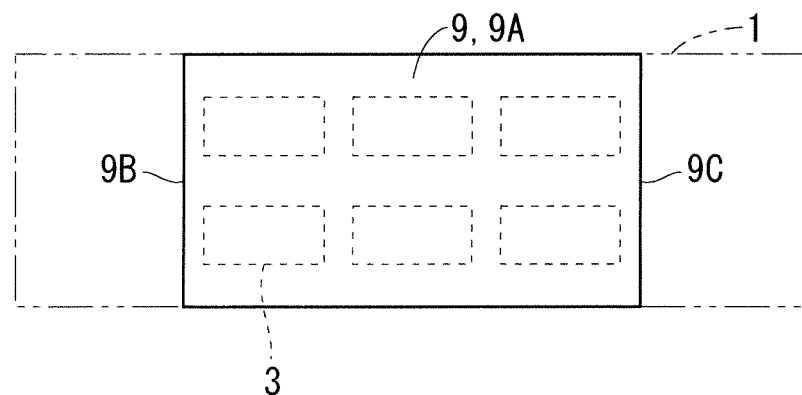
FIG. 37 is a bottom view illustrating the configuration of the heat dissipation sheet in the fifth preferred embodiment.

FIG. 34 is a cross-sectional view illustrating a configuration of a semiconductor device 105 according to the fifth preferred embodiment. FIG. 35 is a bottom view illustrating a configuration of a base plate 1 of the semiconductor device 105. FIGS. 36 and 37 are respectively cross-sectional and bottom views each illustrating a configuration of a heat dissipation sheet 9A in the fifth preferred embodiment. The heat dissipation sheet 9A is provided immediately below a semiconductor chip 3, that is, below the semiconductor chip 3.

With such a configuration, the heat dissipation of the semiconductor module in the central portion where heat generation is concentrated is improved. Further, abnormal heat generation of the semiconductor chip 3 near the outer peripheral portion is also prevented. Abnormal operation of the semiconductor module is reduced.

Sixth Preferred Embodiment

A semiconductor device and a semiconductor module according to a sixth preferred embodiment will be described. The semiconductor device according to the sixth preferred embodiment includes each of the configurations of the semiconductor device 101 according to the modification of the first preferred embodiment. Note that description of the same configurations and operations as those in any one of the first through fifth preferred embodiments will be omitted.

Figure 38:
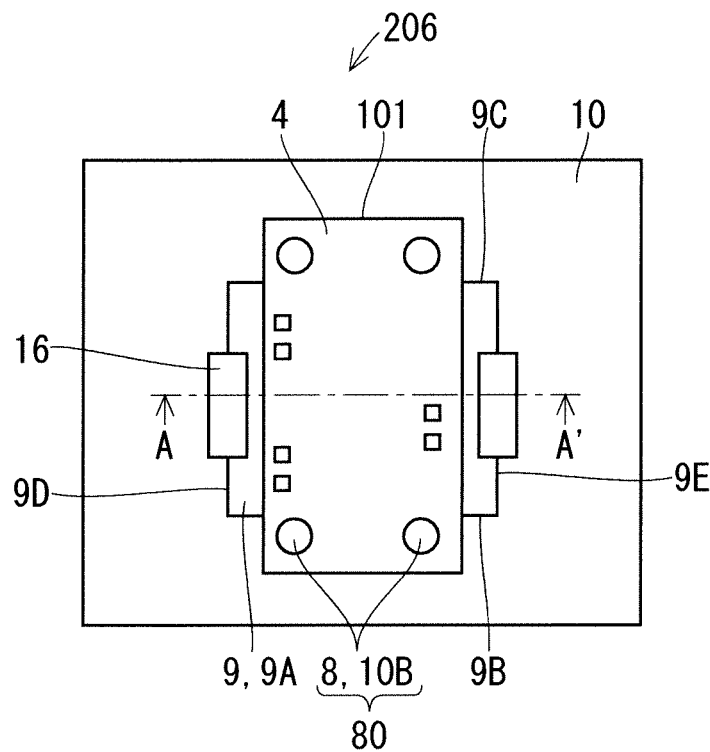
FIG. 38 is a top view illustrating a configuration of a semiconductor module according to a sixth preferred embodiment.
Figure 39:
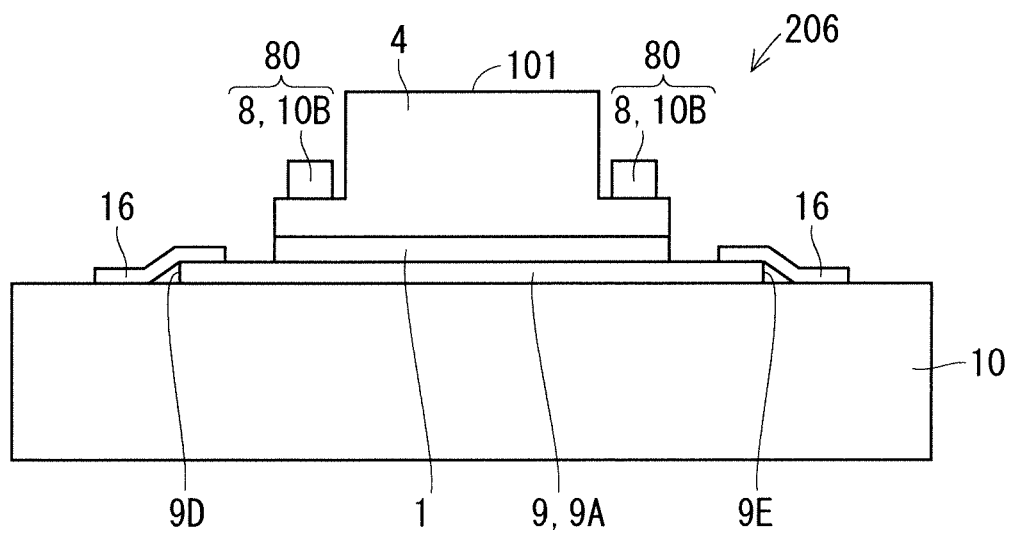
FIG. 39 is a cross-sectional view illustrating the configuration of the semiconductor module according to the sixth preferred embodiment.

FIGS. 38 and 39 are respectively top and cross-sectional views each illustrating a configuration of a semiconductor module 206 according to the sixth preferred embodiment. FIG. 39 illustrates a cross section taken along the line A-A' illustrated in FIG. 38. In FIG. 39, an internal configuration of a case 4 is not illustrated. Additionally, in FIG. 39, hatching of each component is omitted (the same applies to the cross-sectional views thereafter).

Two directions extending along the long side and short side of a rectangle defined by connecting the positions of the attachment portions 8 extend are the longitudinal direction and lateral direction in FIG. 38, respectively. Ends of the heat dissipation member 9 in the longitudinal direction are designated as first ends 9B, 9C, and ends of the heat dissipation member 9 in the horizontal direction are designated as second ends 9D, 9E. Similarly to the first preferred embodiment, the first ends 9B, 9C are located between the two attachment portions 8 that form the long side of the rectangle defined by connecting the positions of the attachment portions 8. The second ends 9D, 9E protrude outside the case 4.

In a manufacturing method of the semiconductor module 206 according to the sixth preferred embodiment, a heat dissipation sheet 9A is first placed on a heat sink 10. At that time, the second ends 9D, 9E of the heat dissipation sheet 9A are temporarily fixed to the heat sink 10 with tape 16, etc. In this state, the semiconductor device 101 is placed on the heat dissipation sheet 9A, and the case 4 and the heat sink 10 are tightened together with screws 10B. Workability is improved by this temporary fixing step.

Seventh Preferred Embodiment

A semiconductor device and a semiconductor module according to a seventh preferred embodiment will be described. The semiconductor device according to the seventh preferred embodiment includes each of the configurations of the semiconductor device 101 according to the modification of the first preferred embodiment. Note that description of the same configurations and operations as those in any one of the first through sixth preferred embodiments will be omitted.

Figure 40:
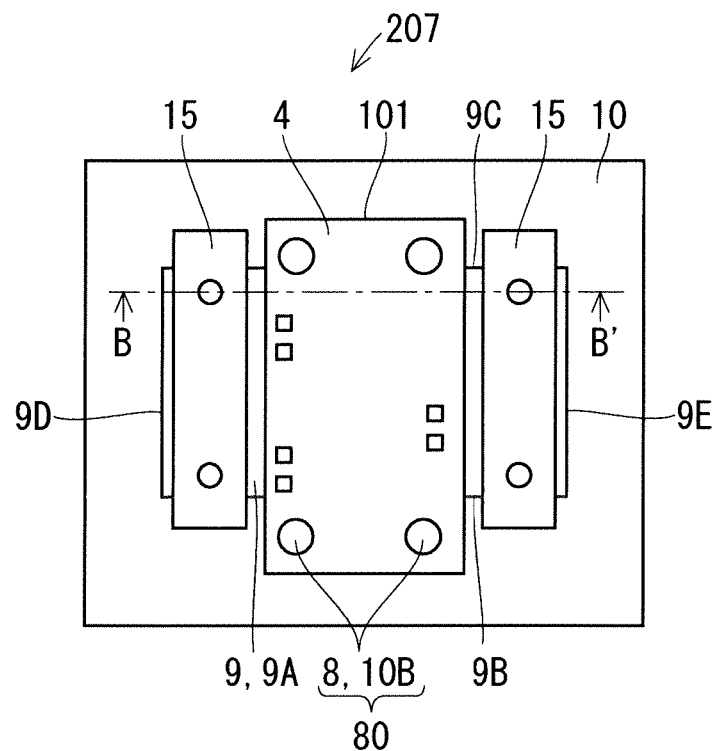
FIG. 40 is a top view illustrating a configuration of a semiconductor module according to a seventh preferred embodiment.
Figure 41:
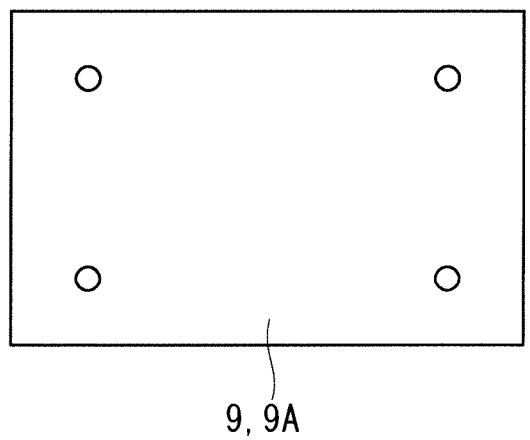
FIG. 41 is a top view illustrating a configuration of a heat dissipation sheet in the seventh preferred embodiment.
Figure 42:
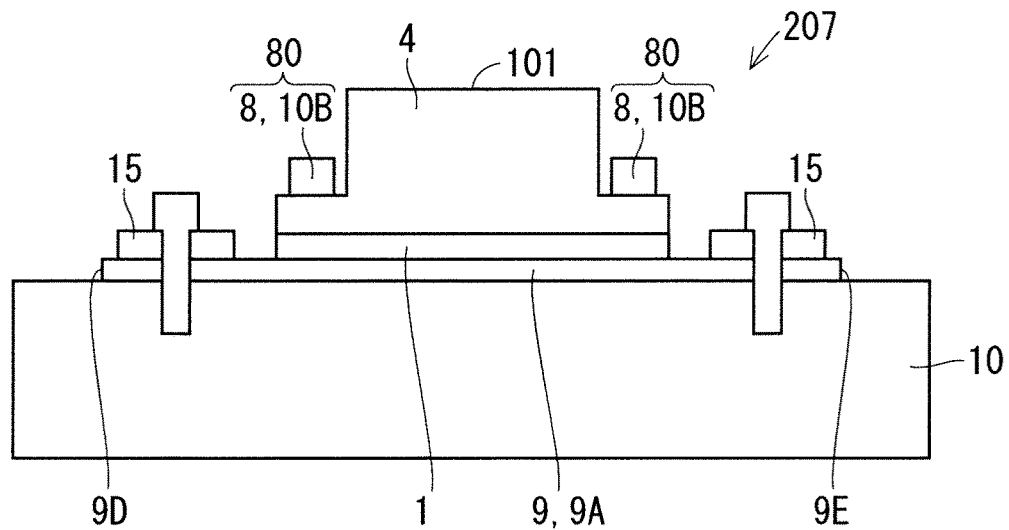
FIG. 42 is a cross-sectional view illustrating the configuration of the semiconductor module according to the seventh preferred embodiment.

FIG. 40 is a top view illustrating a configuration of a semiconductor module 207 according to the seventh preferred embodiment. FIG. 41 is a top view illustrating a configuration of a heat dissipation sheet 9A in the seventh preferred embodiment. FIG. 42 is a cross-sectional view illustrating the configuration of the semiconductor module 207. FIG. 42 illustrates a cross section taken along the line B-B' illustrated in FIG. 40. In FIG. 42, an internal configuration of a case 4 is not illustrated.

Similarly to the sixth preferred embodiment, second ends 9D, 9E of the heat dissipation sheet 9A protrude outside the case 4. The semiconductor module 207 includes pressing plates 15 that press the heat dissipation sheet 9A protruding outside the case 4 toward a heat sink 10 and fix the heat dissipation sheet 9A. The heat sink 10 is provided with screw holes, each of which is to be tightened with a screw. The heat dissipation sheet 9A is provided with holes, through each of which the screw is to be inserted. The pressing plate 15 is fixed to the heat sink 10 by tightening the screws and the screw holes together.

The heat generated in the semiconductor device 101 spreads toward the second ends 9D, 9E of the heat dissipation sheet 9A protruding from the case 4, and then is transferred to the heat sink 10. The heat dissipation of the semiconductor module 207 is improved.

Eighth Preferred Embodiment

A semiconductor device and a semiconductor module according to an eighth preferred embodiment will be described. The semiconductor device according to the eighth preferred embodiment includes each of the configurations of the semiconductor device 101 according to the modification of the first preferred embodiment. Note that description of the same configurations and operations as those in any one of the first through seventh preferred embodiments will be omitted.

Figure 43:
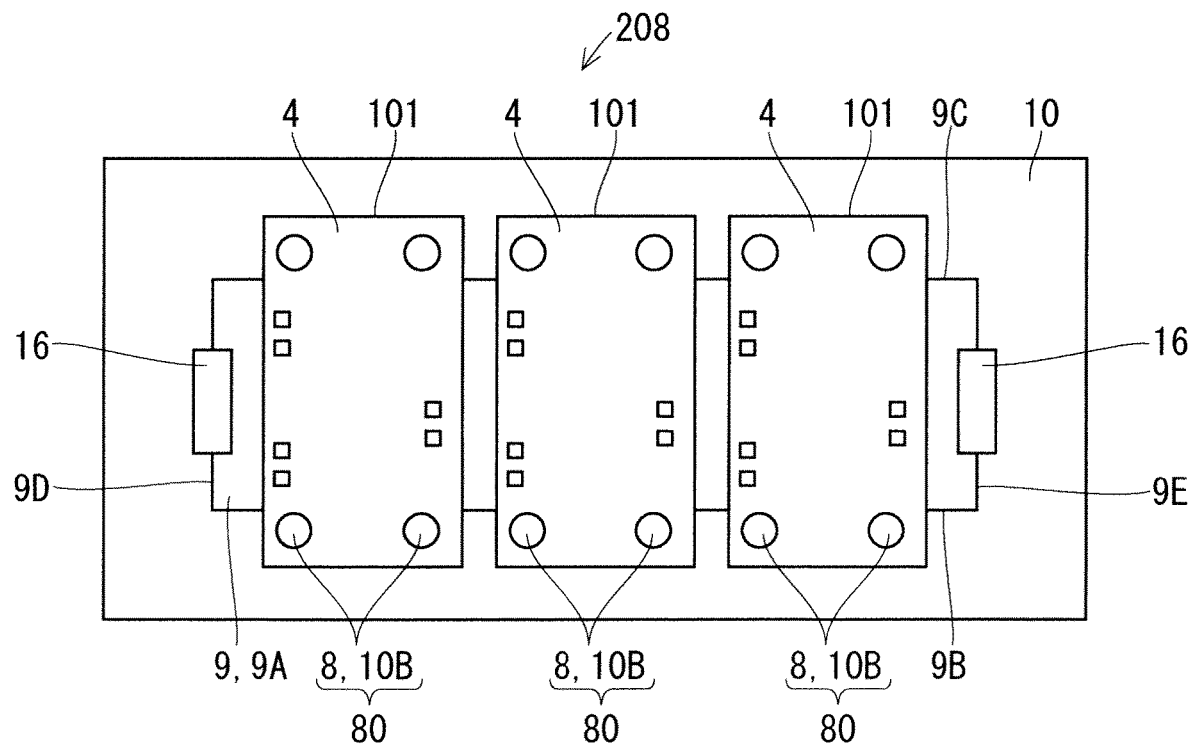
FIG. 43 is a top view illustrating a configuration of a semiconductor module according to an eighth preferred embodiment.
Figure 44:
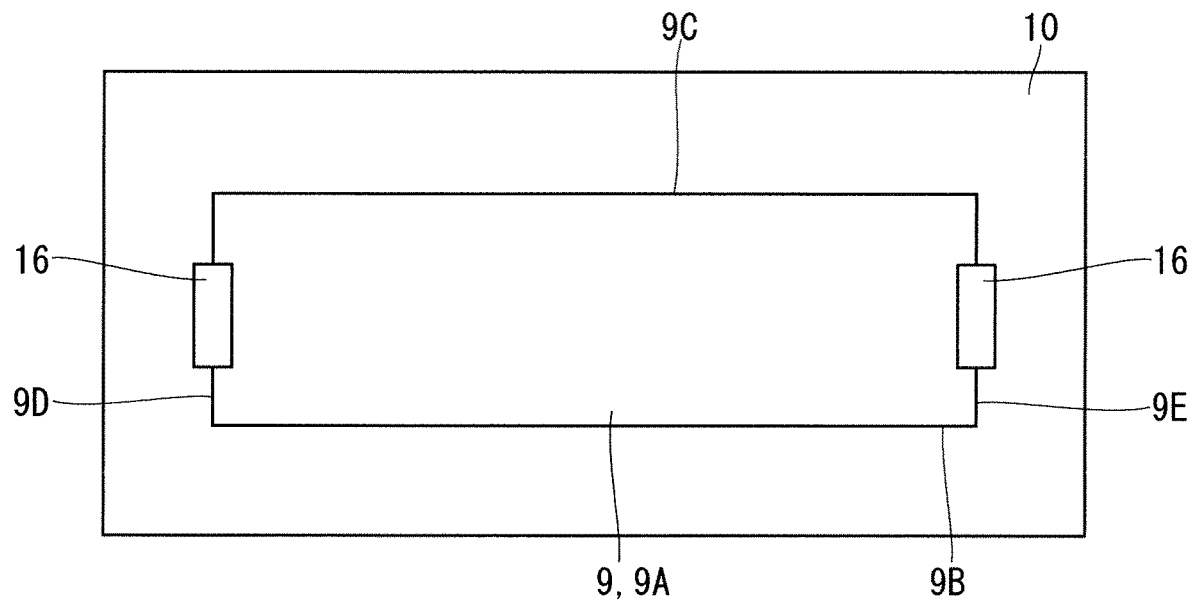
FIG. 44 is a top view illustrating configurations of a heat dissipation sheet and a heat sink in the eighth preferred embodiment.

FIG. 43 is a top view illustrating a configuration of a semiconductor module 208 according to the eighth preferred embodiment. FIG. 44 is a top view illustrating configurations of a heat dissipation sheet 9A and a heat sink 10 in the eighth preferred embodiment.

The semiconductor module 208 includes three semiconductor devices 101. The three semiconductor devices 101 are attached onto one heat sink 10. Similarly to the sixth preferred embodiment, first ends 9B, 9C of the heat dissipation sheet 9A are located between two attachment portions 8 that form a long side of a rectangle defined by connecting the positions of the attachment portions 8. Second ends 9D, 9E of the heat dissipation sheet 9A protrude outside a case 4. The heat dissipation sheet 9A held between the three semiconductor devices 101 and the heat sink 10 is one integrated member.

In a manufacturing method of the semiconductor module 208 according to the eighth preferred embodiment, the heat dissipation sheet 9A is first placed on the heat sink 10. The three semiconductor devices 101 can be mounted on the heat dissipation sheet 9A. At this time, the heat dissipation sheet 9A is temporarily fixed to the heat sink 10 with tape 16, etc. In this state, the three semiconductor devices 101 are placed on the heat dissipation sheet 9A, and the case 4 and the heat sink 10 are tightened together with screws 10B. By such manufacturing steps, installation work of the heat dissipation sheet 9A is reduced, so that work of attaching the semiconductor device 101 is efficiently performed. Further, the effects described in the sixth preferred embodiment are also obtained similarly.

Modification of Eighth Preferred Embodiment

Figure 45:
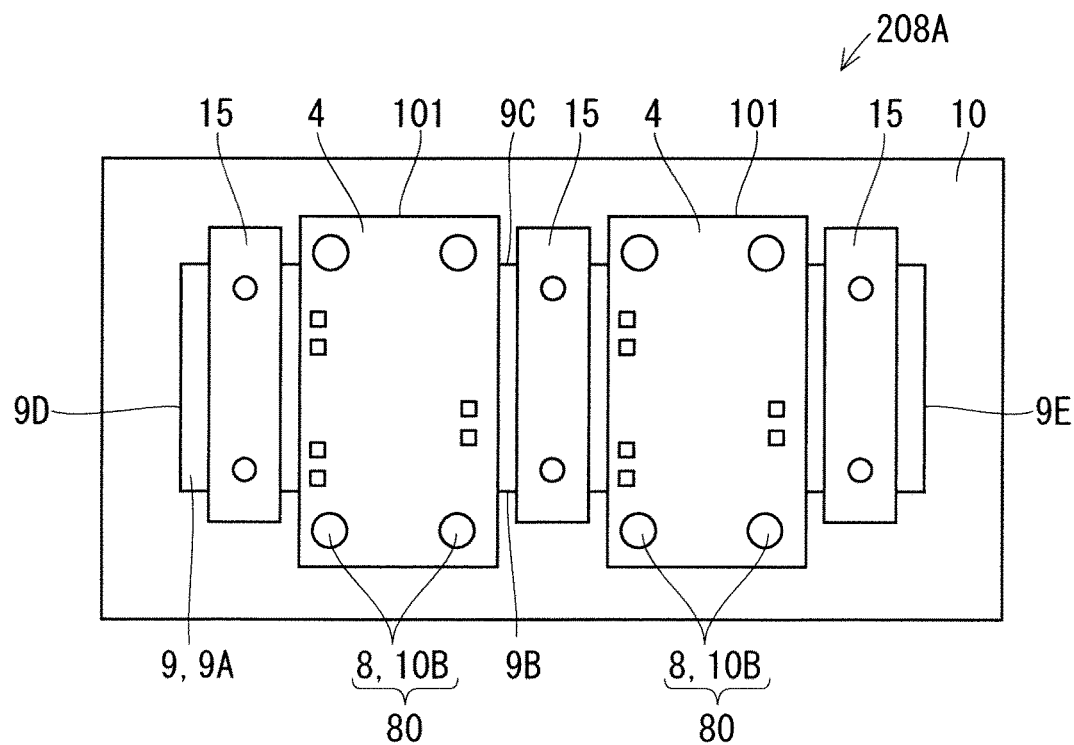
FIG. 45 is a top view illustrating a configuration of a semiconductor module according to a modification of the eighth preferred embodiment.

FIG. 45 is a top view illustrating a configuration of a semiconductor module 208A according to a modification of the eighth preferred embodiment. The semiconductor module 208A includes two semiconductor devices 101. The two semiconductor devices 101 are provided on one heat dissipation sheet 9A. The semiconductor module 208A also includes a pressing plate 15, similarly to the seventh preferred embodiment. The pressing plates 15 press the heat dissipation sheet 9A between the two semiconductor devices 101 and outside the two semiconductor devices 101. Such a semiconductor module 208A has the same effects as those of the sixth to eighth preferred embodiments.

Ninth Preferred Embodiment

A semiconductor device and a semiconductor module according to a ninth preferred embodiment will be described. The semiconductor device according to the ninth preferred embodiment includes each of the configurations of the semiconductor device 101 according to the modification of the first preferred embodiment. Note that description of the same configurations and operations as those in any one of the first through eighth preferred embodiments will be omitted.

Figure 46:
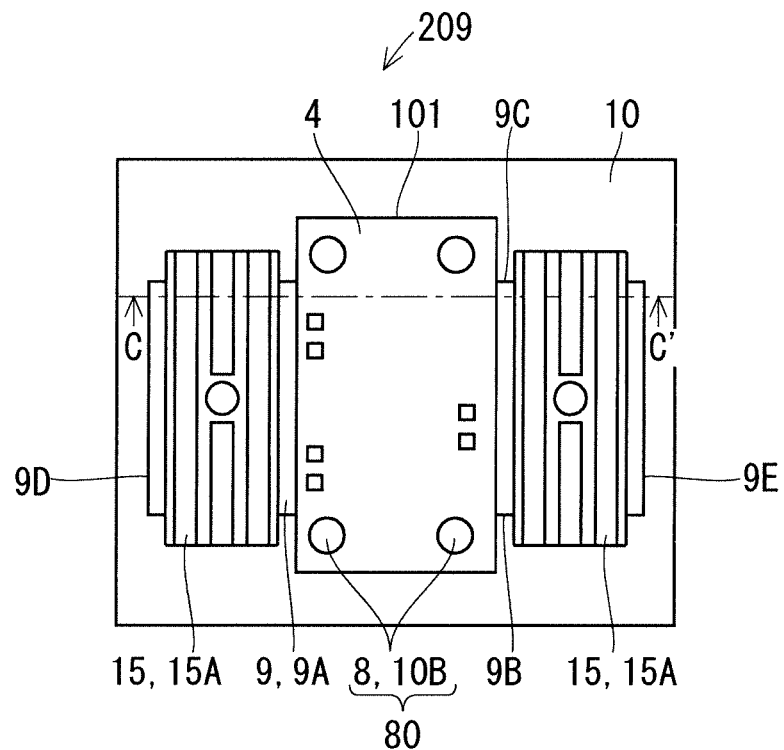
FIG. 46 is a top view illustrating a configuration of a semiconductor module according to a ninth preferred embodiment.
Figure 47:
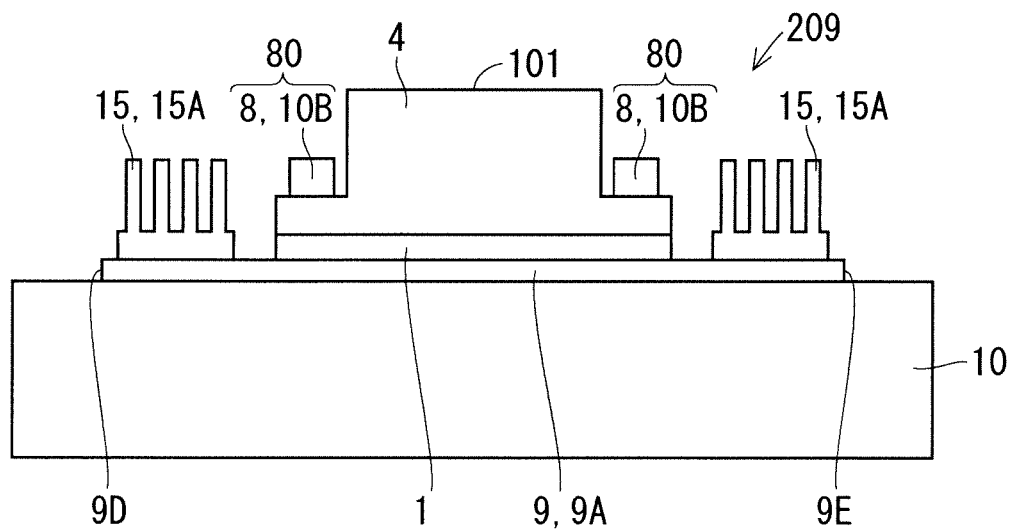
FIG. 47 is a cross-sectional view illustrating the configuration of the semiconductor module according to the ninth preferred embodiment.

FIGS. 46 and 47 are respectively top and cross-sectional views each illustrating a configuration of a semiconductor module 209 according to the ninth preferred embodiment. FIG. 47 illustrates a cross section taken along the line C-C' illustrated in FIG. 46. In FIG. 47, an internal configuration of a case 4 is not illustrated.

The semiconductor module 209 includes pressing plates 15, similarly to the sixth preferred embodiment. However, the pressing plate 15A in the ninth preferred embodiment is a heat dissipation body including heat dissipation fins. Heat generated in the semiconductor device 101 spreads to the heat dissipation sheet 9A protruding from the case 4, and is dissipated from the heat dissipation fins of the pressing plate 15A. The heat dissipation of the semiconductor module 209 is improved.

Tenth Preferred Embodiment

A semiconductor device and a semiconductor module according to a tenth preferred embodiment will be described. The tenth preferred embodiment is a subordinate concept of the first preferred embodiment, and the semiconductor device and the semiconductor module according to the tenth preferred embodiment include the configurations of the semiconductor device 100 and the semiconductor module 200 according to the first preferred embodiment, respectively. Note that description of the same configurations and operations as those in any one of the first through ninth preferred embodiments will be omitted.

Figure 48:
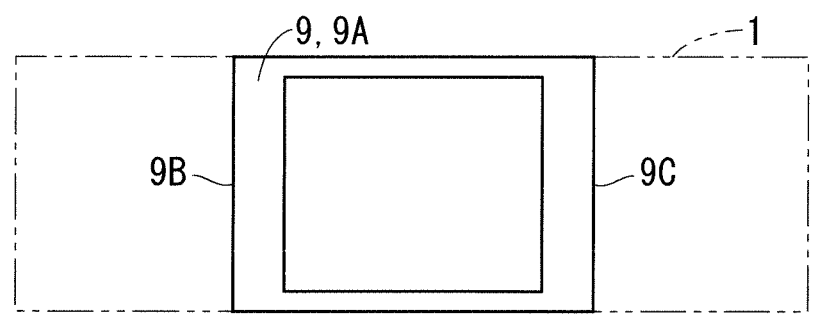
FIG. 48 is a top view illustrating a configuration of a heat dissipation sheet in a tenth preferred embodiment.
Figure 49:
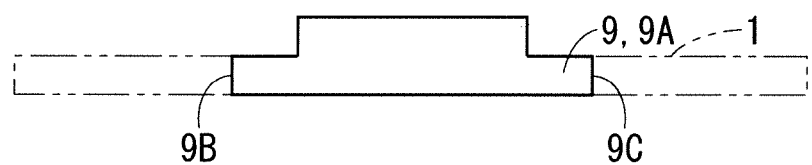
FIG. 49 is a cross-sectional view illustrating the configuration of the heat dissipation sheet in the tenth preferred embodiment.

FIGS. 48 and 49 are respectively top and cross-sectional views each illustrating a configuration of a heat dissipation sheet 9A in the tenth preferred embodiment. A film thickness of the heat dissipation sheet 9A is larger in the central portion than in the outer peripheral portion. In the central portion of the semiconductor device, the contact between the base plate 1 and the heat dissipation sheet 9A and the contact between the heat dissipation sheet 9A and the heat sink 10 are improved. Therefore, the heat dissipation of the semiconductor module is improved.

Eleventh Preferred Embodiment

A semiconductor device and a semiconductor module according to an eleventh preferred embodiment will be described. The eleventh preferred embodiment is a subordinate concept of the first preferred embodiment, and the semiconductor device and the semiconductor module according to the eleventh preferred embodiment include the configurations of the semiconductor device 100 and the semiconductor module 200 according to the first preferred embodiment, respectively. Note that description of the same configurations and operations as those in any one of the first through tenth preferred embodiments will be omitted.

A case 4 in the eleventh preferred embodiment is adhered to a front surface of a base plate 1 with an adhesive material 13 including a resin harder than a resin containing silicone. The adhesive material 13 is made of a hard resin such as, for example, epoxy, not made of a soft material such as silicone.

Since the case 4 is fixed to the base plate 1 with the hard resin, the case 4 and the base plate 1 can be regarded as an integrated part. That is, as the rigidity of the semiconductor device, the rigidity of the case 4 is added to the rigidity of the base plate 1. The base plate 1 is less likely to bend when a screw 10B is tightened in an attachment portion 8. As a result, the heat dissipation of the semiconductor module is improved.

Twelfth Preferred Embodiment

A semiconductor device and a semiconductor module according to a twelfth preferred embodiment will be described. The twelfth preferred embodiment is a subordinate concept of the first preferred embodiment, and the semiconductor device and the semiconductor module according to the twelfth preferred embodiment include the configurations of the semiconductor device 100 and the semiconductor module 200 according to the first preferred embodiment, respectively. Note that description of the same configurations and operations as those in any one of the first through eleventh preferred embodiments will be omitted.

A sealing material 6 in the twelfth preferred embodiment includes a resin that is harder than a resin containing silicone. The sealing material 6 is made of a hard resin such as, for example, epoxy, and is not made of a soft material such as silicone.

As the rigidity of the semiconductor device, the rigidity of the sealing material 6 is added. The base plate 1 is less likely to bend when a screw 10B is tightened in an attachment portion 8. As a result, the heat dissipation of the semiconductor module is improved.

Thirteenth Preferred Embodiment

A semiconductor device and a semiconductor module according to a thirteenth preferred embodiment will be described. The thirteenth preferred embodiment is a subordinate concept of the first preferred embodiment, and the semiconductor device and the semiconductor module according to the thirteenth preferred embodiment include the configurations of the semiconductor device 100 and the semiconductor module 200 according to the first preferred embodiment, respectively. Note that description of the same configurations and operations as those in any one of the first through twelfth preferred embodiments will be omitted.

A heat dissipation sheet 9A in the thirteenth embodiment is made of graphite. Since the heat transfer characteristics, in the surface direction, of the heat dissipation sheet 9A are good, the heat concentrated in the central portion of the semiconductor module is transferred in the surface direction. The heat is transmitted to a heat sink 10, etc., so that the heat dissipation of the semiconductor module is improved.

In the present disclosure, each preferred embodiment can be freely combined or appropriately modified or omitted.

While the disclosure has been shown and described in detail, the foregoing description is in all aspects illustrative and not restrictive. It is therefore understood that numerous modifications and variations can be devised.

What is claimed is:
1. A semiconductor device comprising:
a base plate having a front surface side and a back surface side;
a semiconductor chip held on the front surface side of the base plate;
a case including a plurality of attachment portions formed therein, the plurality of attachment portions configured to attach the case to a heat sink, a lowermost end of the case contacts a front surface of the base plate so as to house the semiconductor chip inside; and
a heat dissipation member provided on a back surface of the base plate and contactable with the heat sink for cooling the semiconductor chip, wherein
an entirety of the case is provided on the front surface side,
the heat sink is provided on the back surface side, and
ends of the heat dissipation member in a direction extending along a long side of a plurality of sides that form a shape defined by connecting positions of the plurality of attachment portions in plan view are located between the two attachment portions that form the long side.

2. The semiconductor device according to claim 1, wherein
ends of the base plate in the direction extending along the long side are located between the two attachment portions that form the long side,
the ends of the heat dissipation member in the direction extending along the long side are located inside the ends of the base plate, and
ends of the heat dissipation member in a direction extending along a side different from the long side are located on the long side or on an outer peripheral side, beyond the long side, of the case.

3. The semiconductor device according to claim 1, wherein the heat dissipation member has an outer shape whose at least one corner is chamfered in plan view.

4. The semiconductor device according to claim 1, wherein the heat dissipation member is provided below the semiconductor chip.

5. The semiconductor device according to claim 1, wherein a film thickness of the heat dissipation member is larger in a central portion than in an outer peripheral portion.

6. The semiconductor device according to claim 1, further comprising a sealing material provided inside the case to seal the semiconductor chip housed in the case, wherein
the sealing material includes a resin harder than a resin containing silicone.

7. The semiconductor device according to claim 1, wherein the heat dissipation member is a heat dissipation sheet made of graphite.

8. A semiconductor module comprising:
at least one semiconductor device according to claim 1;
the heat sink in contact with the back surface of the base plate via the heat dissipation member and configured to cool the semiconductor chip; and
a plurality of fixing portions that fix the case to the heat sink via the plurality of attachment portions, wherein
the plurality of fixing portions fix the case to the heat sink by applying stress in a direction toward the heat sink to the case.

9. The semiconductor module according to claim 8, wherein a film thickness of the heat dissipation member held between the base plate and the heat sink is 200 µm or less.

10. The semiconductor module according to claim 8, wherein the ends of the heat dissipation member in the direction extending along the side different from the long side protrude outside the case.

11. The semiconductor module according to claim 10, further comprising a pressing plate pressing the heat dissipation member protruding outside the case toward the heat sink.

12. The semiconductor module according to claim 11, wherein the pressing plate is a heat dissipation body including a heat dissipation fin.

13. The semiconductor module according to claim 8, wherein the at least one semiconductor device includes a plurality of semiconductor devices, and the heat dissipation members in the plurality of semiconductor devices are integrated with each other.

14. A semiconductor device comprising:

a base plate;

a semiconductor chip held on a front surface side of the base plate;

a case including a plurality of attachment portions formed therein, the plurality of attachment portions configured to attach the case to a heat sink, the case provided on a front surface of the base plate so as to house the semiconductor chip inside; and a heat dissipation member provided on a back surface of the base plate and contactable with the heat sink for cooling the semiconductor chip, wherein ends of the heat dissipation member in a direction extending along a long side of a plurality of sides that form a shape defined by connecting positions of the plurality of attachment portions in plan view are located between the two attachment portions that form the long side, and the case is joined to the front surface of the base plate with a resin harder than a resin containing silicone located in a recess between the case and the base plate.

* * * * *